United States Patent

Furuichi

(10) Patent No.: US 10,340,238 B2
(45) Date of Patent: Jul. 2, 2019

(54) WIRING SUBSTRATE AND SEMICONDUCTOR DEVICE

(71) Applicant: SHINKO ELECTRIC INDUSTRIES CO., LTD., Nagano-shi, Nagano-ken (JP)

(72) Inventor: Jun Furuichi, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 16/106,236

(22) Filed: Aug. 21, 2018

(65) Prior Publication Data

US 2019/0067224 A1 Feb. 28, 2019

(30) Foreign Application Priority Data

Aug. 28, 2017 (JP) ................. 2017-163269

(51) Int. Cl.

| H01L 23/48 | (2006.01) |
|---|---|
| H01L 23/52 | (2006.01) |
| H01L 29/40 | (2006.01) |
| H01L 23/00 | (2006.01) |
| H05K 1/11 | (2006.01) |
| H05K 3/46 | (2006.01) |
| H01L 23/31 | (2006.01) |

(Continued)

(52) U.S. Cl.
CPC ............. *H01L 24/03* (2013.01); *H01L 23/12* (2013.01); *H01L 23/3128* (2013.01); *H01L 23/49811* (2013.01); *H05K 1/111* (2013.01); *H05K 3/4644* (2013.01); *H01L 2224/131* (2013.01); *H01L 2924/181* (2013.01)

(58) Field of Classification Search
CPC ............. H01L 23/53295; H01L 23/15; H01L 21/4857; H01L 24/97; H01L 2924/3511; H01L 21/486; H01L 23/49822
USPC ................................. 257/750, 758
See application file for complete search history.

(56) References Cited

U.S. PATENT DOCUMENTS

| 7,474,538 B2 * | 1/2009 | Kikuchi ................. H01L 23/13 |
| | | 257/E23.004 |
| 2009/0145636 A1 * | 6/2009 | Miki .................... H01L 21/6835 |
| | | 174/255 |

(Continued)

FOREIGN PATENT DOCUMENTS

JP       2015-191968 A    11/2015

*Primary Examiner* — S. V. Clark
(74) *Attorney, Agent, or Firm* — Tarolli, Sundheim, Covell & Tummino LLP

(57) ABSTRACT

A wiring substrate includes a first wiring structure. The first wiring structure has a first insulation layer including a reinforcement material. A first wiring layer is embedded in the first insulation layer. A second wiring structure having a higher wiring density than the first wiring structure is formed on the first insulation layer. The second wiring structure includes at least one second insulation layer and two or more second wiring layers. A lower surface of the first wiring layer is flush with a lower surface of the first insulation layer. The reinforcement material is located toward the second wiring structure from a thickness-wise center of the first insulation layer and laid out at a thickness-wise center of a thickness from the lower surface of the first insulation layer to an upper surface of the uppermost second wiring layer in the second wiring structure.

6 Claims, 13 Drawing Sheets

(51) Int. Cl.
*H01L 23/498* (2006.01)
*H01L 23/12* (2006.01)

(56) References Cited

U.S. PATENT DOCUMENTS

| | | | | |
|---|---|---|---|---|
| 2010/0044845 A1* | 2/2010 | Funaya | ............... | H01L 21/6835 257/685 |
| 2011/0155433 A1* | 6/2011 | Funaya | ............. | H01L 23/49827 174/258 |
| 2012/0319254 A1* | 12/2012 | Kikuchi | ............. | H01L 23/5389 257/659 |

* cited by examiner

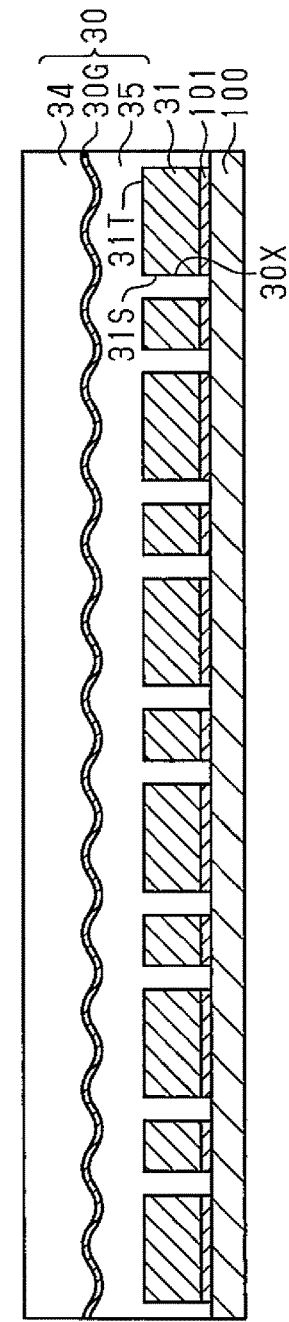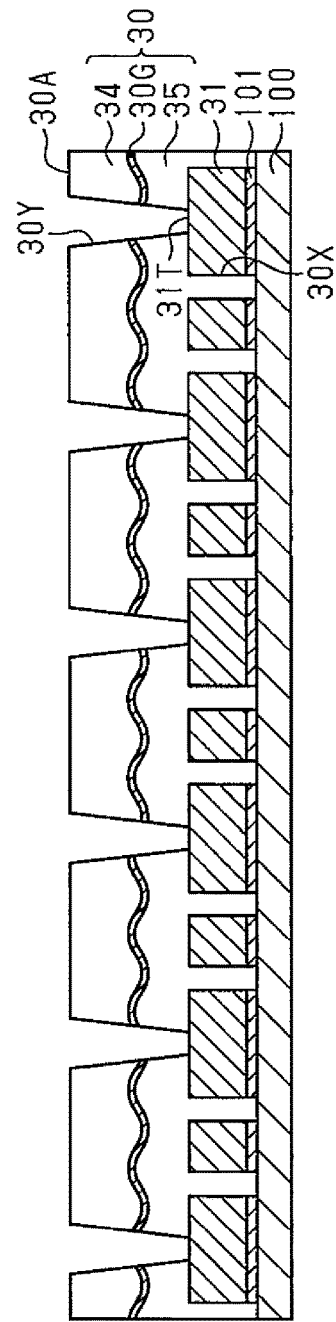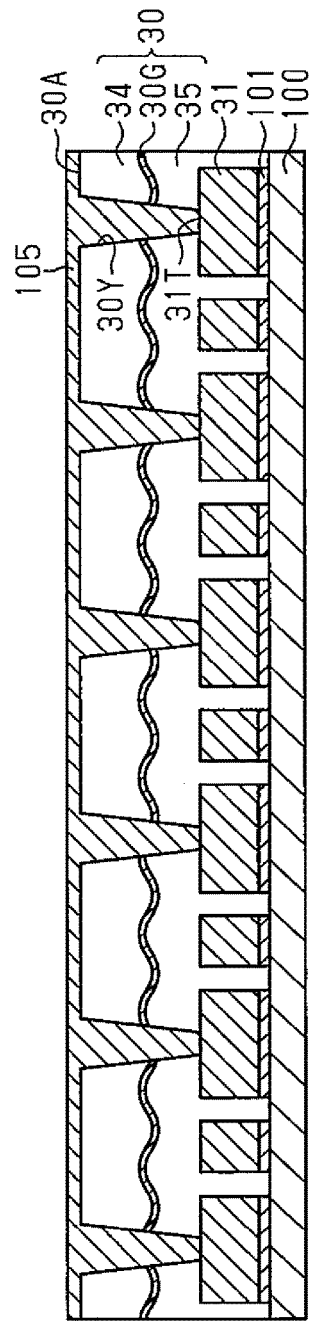

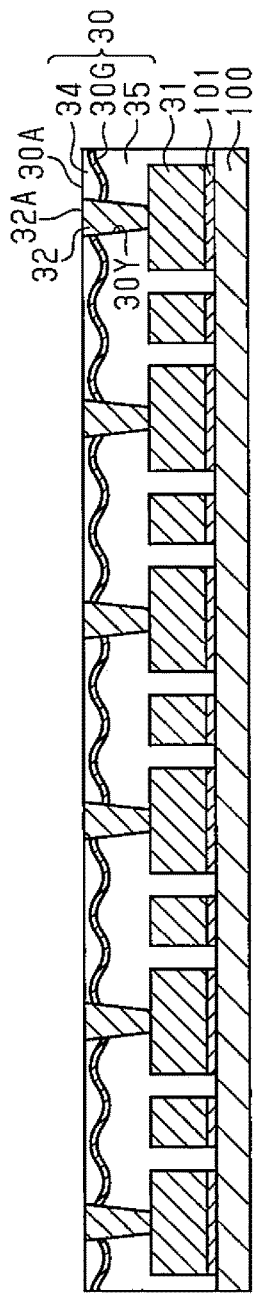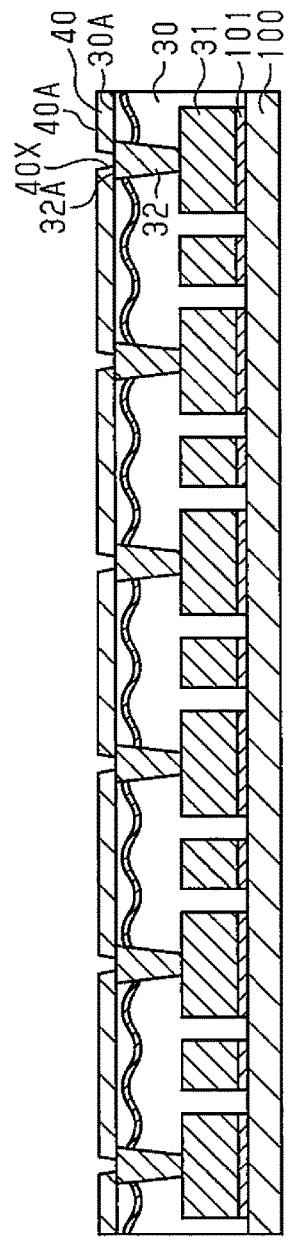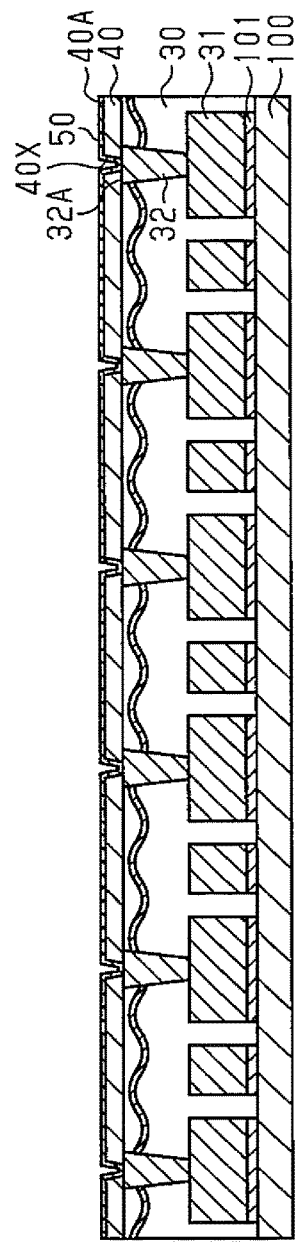

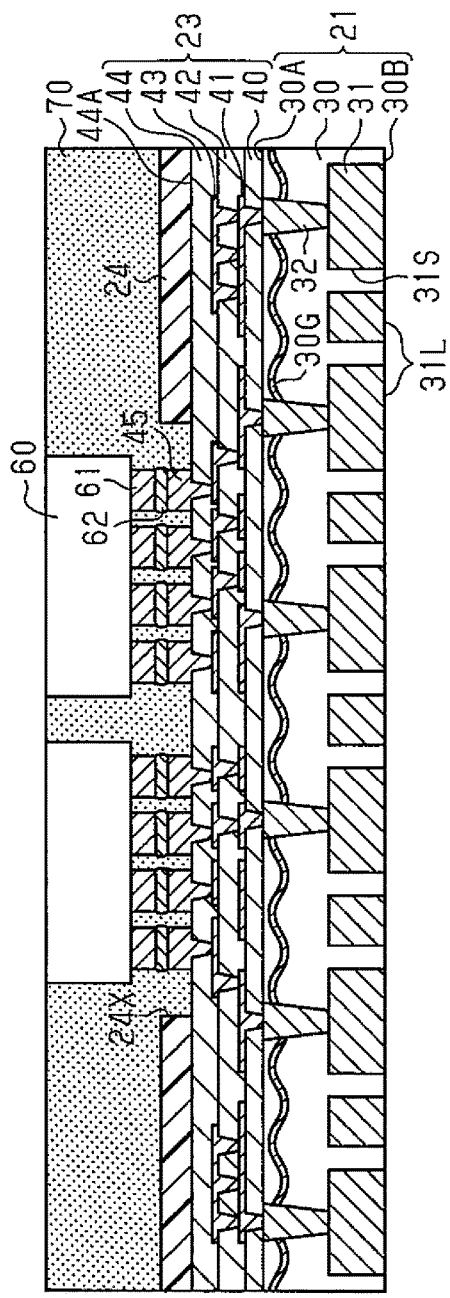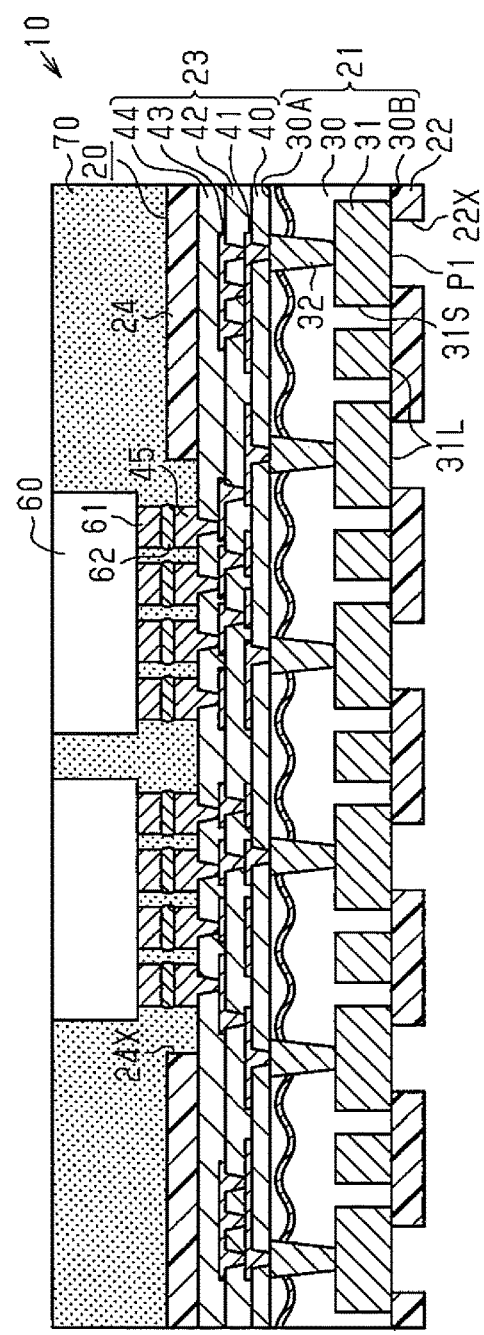

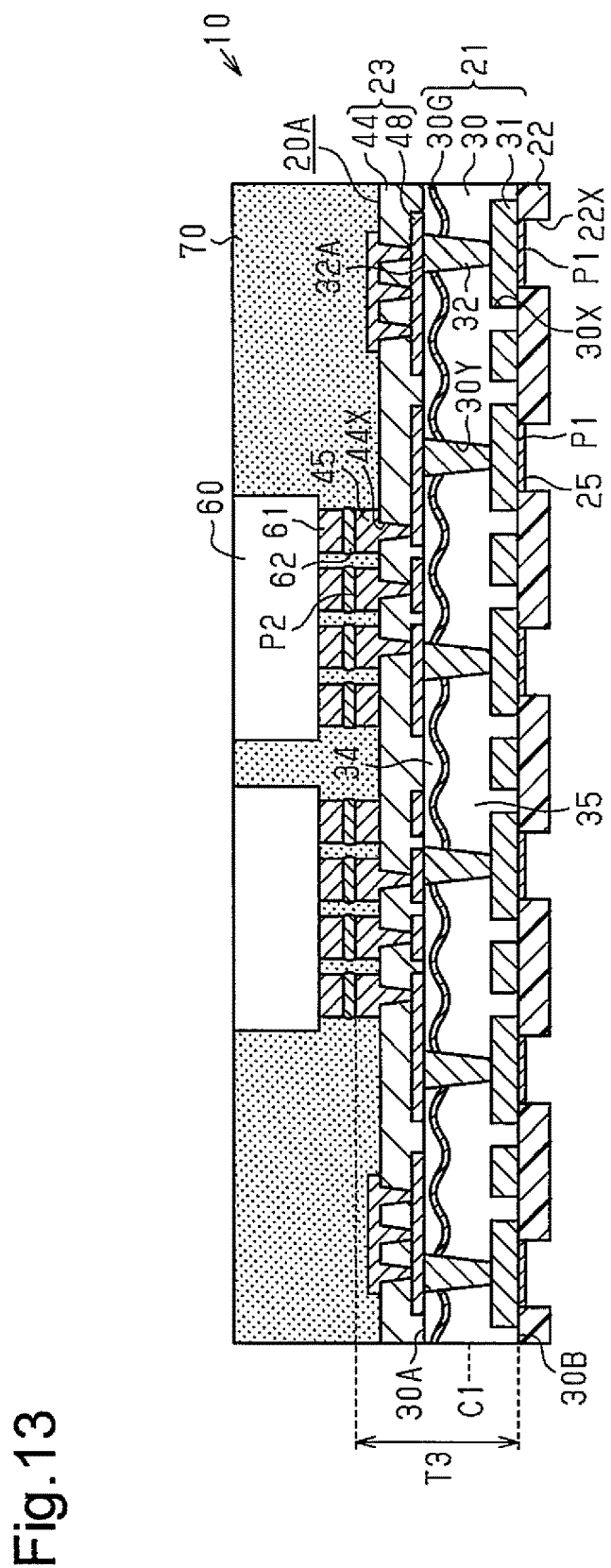

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2017-163269, filed on Aug. 28, 2017, the entire contents of which are incorporated herein by reference.

FIELD

This disclosure relates to a wiring substrate, a semiconductor device, a method for manufacturing a wiring substrate, and a semiconductor device.

BACKGROUND

An electronic component such as a semiconductor chip is mounted on a wiring substrate. To increase the density of wiring patterns, a known buildup process is performed by alternately stacking wiring layers and insulation layers. Japanese Laid-Open Patent Publication No. 2015-191968 describes an example of such type of a wiring substrate. In the wiring substrate described in the publication, a high-density wiring layer that includes an insulation layer formed from a photosensitive resin is laminated on a low-density wiring layer that includes an insulation layer formed from a thermosetting resin.

FIG. 15 illustrates one example of a wiring substrate in the related art. A wiring substrate 200 includes a low-density wiring layer 201, a solder resist layer 202 formed on the lower surface of the low-density wiring layer 201, and a high-density wiring layer 203 formed on the upper surface of the low-density wiring layer 201. The low-density wiring layer 201 has a structure obtained by sequentially laminating a wiring layer 211, an insulation layer 212, a wiring layer 213, an insulation layer 214, a wiring layer 215, and an insulation layer 216. The insulation layers 212, 214, and 216 are formed from an insulative resin of which the main component is a thermosetting resin. The high-density wiring layer 203 has a structure obtained by sequentially laminating a wiring layer 220, an insulation layer 221, a wiring layer 222, an insulation layer 223, a wiring layer 224, an insulation layer 225, and a wiring layer 226 on the upper surface of the insulation layer 216. The insulation layers 221, 223, and 225 are formed from an insulative resin of which the main component is a photosensitive resin.

The wiring substrate 200 does not include a core substrate (support substrate) that is highly rigid and thicker than the insulation layers 212, 214, 216, and the like. This allows the wiring substrate 200 to be entirely reduced in thickness.

SUMMARY

However, without a core substrate, the rigidity of the wiring substrate 200 is lowered. Thus, the wiring substrate 200 has a tendency to warp.

One embodiment is a wiring substrate. The wiring substrate includes a first wiring structure. The first wiring structure includes a first insulation layer formed from a thermosetting insulative resin and including a reinforcement material. The first wiring structure also includes a recess formed in a lower surface of the first insulation layer and a first wiring layer with which the recess is filled. The first wiring structure also includes a via wiring including an upper end surface exposed from an upper surface of the first insulation layer. The via wiring extends in a thickness-wise direction through the first insulation layer and is connected to the first wiring layer. The wiring substrate further includes a protective insulation layer formed on the lower surface of the first insulation layer and a second wiring structure laminated on the upper surface of the first insulation layer. The second wiring structure includes at least one second insulation layer formed from an insulative resin of which main component is a photosensitive resin and two or more second wiring layers. The upper surface of the first insulation layer and the upper end surface of the via wiring are polished surfaces. The first wiring layer includes a lower surface formed to be flush with the lower surface of the first insulation layer or recessed from the lower surface of the first insulation layer toward the second wiring structure. The second wiring structure has a wiring density that is higher than a wiring density of the first wiring structure. The reinforcement material is located toward the second wiring structure from a thickness-wise center of the first insulation layer and is located at a thickness-wise center of a thickness from the lower surface of the first insulation layer to an upper surface of an uppermost one of the two or more second wiring layers.

Other embodiments and advantages thereof will become apparent from the following description, taken in conjunction with the accompanying drawings, illustrating by way of example the principles of the invention. It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 3A to 3D, 4A to 4C, 5A to 5C, 6A to 6C, 7A, 7B, 8A, 8B, 9A, and 9B are schematic cross-sectional views illustrating a method for manufacturing the semiconductor device of FIG. 1A;

FIG. 13 is a schematic cross-sectional view illustrating a further modified example of the semiconductor device;

DESCRIPTION OF THE EMBODIMENTS

Figure 1A:
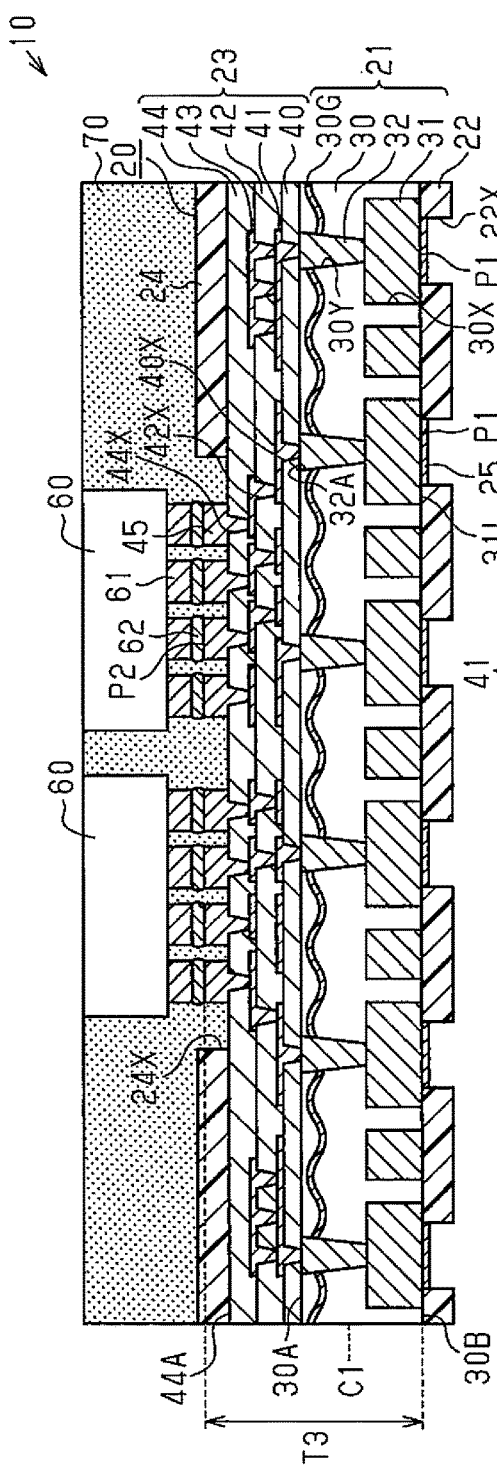
FIG. 1A is a schematic cross-sectional view illustrating one embodiment of a semiconductor device taken along line 1a-1a in FIG. 2.

One embodiment will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings.

As illustrated in FIG. 1A, a semiconductor device 10 includes a wiring substrate 20, one or more (two in this example) semiconductor chips 60 mounted on the wiring substrate 20, and an encapsulation resin 70 partially covering the semiconductor chips 60.

The wiring substrate 20 includes a wiring structure 21, a solder resist layer 22 laminated on the lower side of the wiring structure 21, a wiring structure 23 laminated on the upper side of the wiring structure 21, and a solder resist layer 24 laminated on the upper side of the wiring structure 23.

The wiring structure 21 will first be described. The wiring structure 21 is a low-density wiring layer with wirings laid out at a lower density than the wiring structure 23. The wiring structure 21 includes an insulation layer 30, a wiring layer 31, and via wirings 32 extending through the insulation layer 30 in the thickness-wise direction.

For example, a thermosetting insulative resin including reinforcement material may be used as the material of the insulation layer 30. For example, the material of the insulation layer 30 may be a glass epoxy resin obtained by impregnating a glass cloth (glass woven cloth), which is a reinforcement material, with a thermosetting insulative resin, of which the main component is an epoxy resin, and hardening the resin. The thermosetting insulative resin is not limited to an epoxy resin. For example, an insulative resin such as polyimide resin, cyanate resin, and the like may be used as the thermosetting insulative resin. The insulation layer 30 may include, for example, a filler such as silica, alumina, or the like.

Figure 1B:
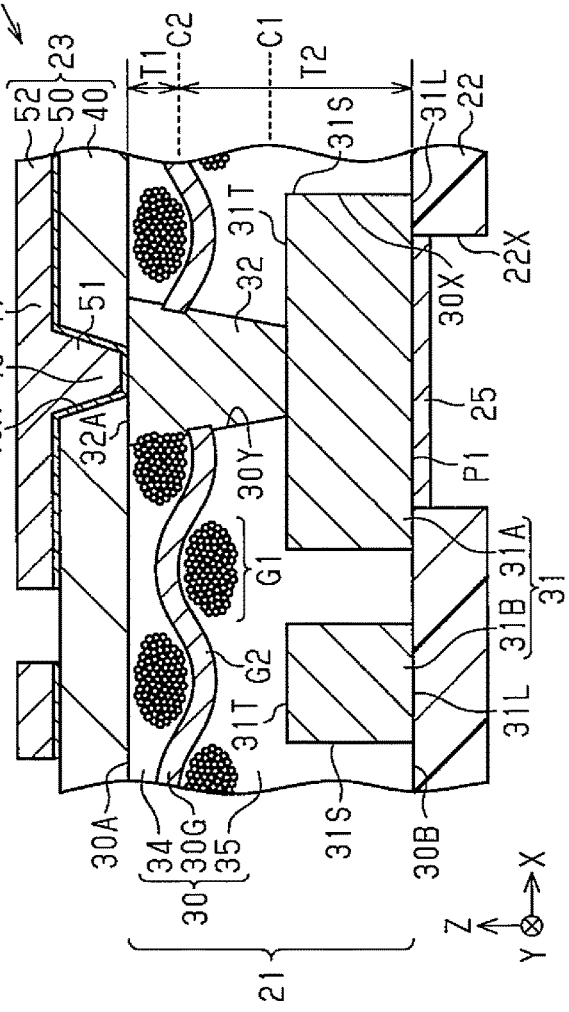
FIG. 1B is an enlarged cross-sectional view of part of the semiconductor device illustrated in FIG. 1A.

As illustrated in FIG. 1B, the insulation layer 30 includes a given number (one in this example) of a glass cloth 30G, a resin layer 34 covering the upper surface of the glass cloth 30G, and a resin layer 35 covering the lower surface of the glass cloth 30G. In the present example, entire surfaces of the glass cloth 30G are covered by the resin layers 34 and 35. Thus, the glass cloth 30G is not exposed from an upper surface 30A and a lower surface 30B of the insulation layer 30.

The glass cloth 30G is formed by, for example, plain-weaving glass fiber bundles G1 that are arranged next to one another in the X-axis direction and glass fiber bundles G2 that arranged next to one another in the Y-axis direction in a grid-like manner. Each of the glass fiber bundles G1 and G2 is a bundle of a number of glass fibers, each having a diameter of approximately 1 to 2 µm. The glass fiber bundles G1 and G2 each have a thickness of, for example, approximately 15 to 20 µm. There is particularly no limit to the overall cross-sectional shape of each of the glass fiber bundles G1 and G2. For example, the glass fiber bundles G1 and G2 may have an elliptical or circular cross-section.

Instead of the glass cloth 30G using the glass fiber bundles G1 and G2, the reinforcement material may be a woven cloth or a non-woven cloth using carbon fiber bundles, polyester fiber bundles, nylon fiber bundles, aramid fiber bundles, liquid crystal polymer fibers, or the like. Further, the fiber bundles do not have to be plain-woven and may be, for example, satin-woven or twill-woven.

The glass cloth 30G in the insulation layer 30 is located toward the wiring structure 23 (in the present example, upper surface 30A of insulation layer 30) from the center C1 of the insulation layer 30 in the thickness-wise direction. In the present example, the center C2 of the glass cloth 30G in the thickness-wise direction is located toward the wiring structure 23 from the center C1 of the insulation layer 30 in the thickness-wise direction. The resin layer 34 has a thickness T1 (thickness from upper surface 30A of insulation layer 30 to center C2), and the resin layer 35 has a thickness T2 (thickness from center C2 to lower surface 30B of insulation layer 30). In the insulation layer 30 of the present example, the thickness T1 of the resin layer 34 is set to be smaller than the thickness T2 of the resin layer 35.

Further, the glass cloth 30G is located proximate to the center of the entire wiring substrate 20 in the thickness-wise direction. In the present example, as illustrated in FIG. 1A, the glass cloth 30G is located at the center in the thickness-wise direction of a thickness T3 from the lower surface 30B of the insulation layer 30 to the upper surface of a wiring layer 45, which is the uppermost wiring layer of the wiring structure 23. Thus, when viewing the wiring substrate 20 in the vertical direction (thickness-wise direction), the wiring substrate 20 is constructed so that the upper side of the highly rigid glass cloth 30G is nearly symmetric to the lower side of the glass cloth 30G. As a result, the wiring substrate 20 is constructed to resist warping.

For example, as illustrated in FIGS. 1A and 1B, the thickness T1 of the resin layer 34 and the thickness T2 of the resin layer 35 are set to lay out the glass cloth 30G in the wiring substrate 20 proximate to the thickness-wise center of the thickness T3. For example, the thickness T1 of the resin layer 34 may be set to be approximately one-half to one-third of the thickness T2 of the resin layer 35. The thickness T1 of the resin layer 34 may be, for example, approximately 10 to 15 µm, and the thickness T2 of the resin layer 35 may be approximately 20 to 30 µm. The insulation layer 30 may have a thickness from the upper surface 30A to the lower surface 30B that is, for example, approximately 30 to 45 µm.

The lower surface 30B of the insulation layer 30 includes recesses 30X at given locations. The recesses 30X are recessed toward the upper surface 30A of the insulation layer 30. Each recess 30X extends from the lower surface 30B of the insulation layer 30 to an intermediate position in the thickness-wise direction of the insulation layer 30. Accordingly, the bottom surface of each recess 30X is located at an intermediate position in the thickness-wise direction of the insulation layer 30. The recesses 30X may each have a depth of, for example, approximately 15 to 20 µm.

The wiring layer 31 is formed in the recesses 30X. The wiring layer 31 includes an upper surface 31T, a lower surface 31L, and a side surface 31S extending between the upper surface 31T and the lower surface 31L. The wiring layer 31 is embedded in the insulation layer 30. In other words, the recesses 30X are filled with the wiring layer 31. In the present example, the upper surface 31T of the wiring layer 31 is in contact with the bottom surface of each recess 30X. Further, the upper surface 31T and side surface 31S of the wiring layer 31 are entirely covered by the insulation layer 30. The lower surface 31L of the wiring layer 31 is exposed from the lower surface 30B of the insulation layer 30. The lower surface 31L of the wiring layer 31 is flush with the lower surface 30B of the insulation layer 30. In this manner, the insulation layer 30 contacts and entirely covers the upper surface 31T and side surface 31S of the wiring layer 31. Further, the insulation layer 30 entirely exposes the lower surface 31L of the wiring layer 31.

The wiring layer 31 may have a thickness of, for example, approximately 15 to 20 µm. The wiring layer 31 may have a line-and-space (L/S) of, for example, approximately 20 µm/20 µm. The line-and-space (L/S) refers to the wiring width and the wiring interval between adjacent wirings. For example, copper or a copper alloy may be used as the material the wiring layer 31.

The wiring layer 31 includes, for example, wiring patterns 31A, which are connected to the via wirings 32, and conductor patterns 31B, which are formed in regions where the wiring patterns 31A are not formed (laid out). The wiring patterns 31A function as external connection pads P1 that are connected to external connection terminals when, for example, mounting the semiconductor device 10 on a mounting substrate such as a motherboard. The conductor patterns 31B may function as, for example, dummy patterns. The conductor patterns 31B may be formed to be, for example, solid. When the conductor patterns 31B are dummy patterns, for example, the conductor patterns 31B are not electrically connected to the via wirings 32 and electrically isolated (in floating state). Alternatively, the conductor patterns 31B may be, for example, wiring patterns laying out wirings. When the conductor patterns 31B are wiring patterns, for example, the conductor patterns 31B are electrically connected to the external connection pads P1.

Figure 2:
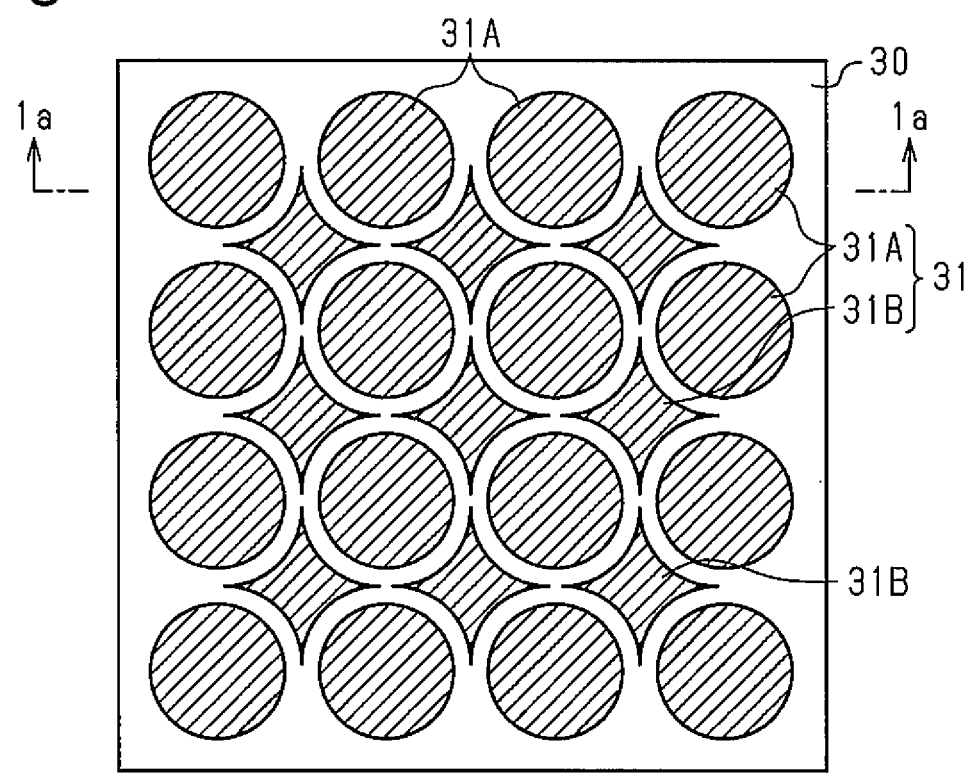
FIG. 2 is a schematic plan view of the semiconductor device.

FIG. 2 is a plan view illustrating a case in which the conductor patterns 31B are dummy patterns. As illustrated in FIG. 2, the wiring patterns 31A are, for example, laid out in a matrix in a plan view. The conductor patterns 31B are, for example, laid out between adjacent wiring patterns 31A. The wiring patterns 31A and the conductor patterns 31B may have any planar shape and size. For example, the wiring patterns 31A may each have a circular planar shape having a diameter of approximately 200 to 400 μm. The conductor patterns 31B may each have a rhombus planar shape. FIG. 2 is a plan view of the wiring substrate 20 illustrated in FIG. 1A taken from the lower side. The solder resist layer 22 is not illustrated in FIG. 2.

As illustrated in FIG. 1B, the insulation layer 30 includes through holes 30Y that open at given locations in the upper surface 30A, extend through the insulation layer 30 in the thickness-wise direction, and expose portions of the upper surface 31T of the wiring layer 31. The through holes 30Y are each tapered so that the diameter decreases from the upper side as viewed in FIG. 1B (in present example, upper surface 30A of insulation layer 30 on which wiring structure 23 is laminated) toward the lower side (upper surface 31T of wiring layer 31). For example, the through holes 30Y each have the shape of a reversed truncated cone so that the diameter of the lower open end is smaller than the diameter of the upper open end. For example, the diameter of each open through hole 30Y at the upper open end may be approximately 50 to 100 μm.

The upper surface 30A of the insulation layer 30 is a smooth surface (low roughness surface) having few irregularities. For example, the upper surface 30A of the insulation layer 30 is a polished surface. The upper surface 30A of the insulation layer 30 has, for example, a smaller surface roughness than the wall surfaces of the through holes 30Y. The upper surface 30A of the insulation layer 30 has a roughness set to, for example, a surface roughness Ra value of approximately 15 to 40 nm. The wall surfaces of the through holes 30Y have a roughness set to, for example, a surface roughness Ra value of approximately 300 to 400 nm. The surface roughness Ra value is also referred to as the arithmetic average roughness and obtained by measuring absolute height values, which vary in a measurement region from a surface set as a mean line, and calculating the arithmetic average of the absolute values.

The via wirings 32 are formed in the through holes 30Y and connected to the wiring layer 31. The via wirings 32 extend through the insulation layer 30 in the thickness-wise direction. In the present example, the through holes 30Y are filled with the via wirings 32. Thus, in the same manner as the through holes 30Y, the via wirings 32 each have the shape of a reversed truncated cone so that the diameter of an upper end surface 32A is larger than the diameter of a lower end surface.

The upper end surface 32A of each via wiring 32 is exposed from the upper surface 30A of the insulation layer 30. For example, the upper end surface 32A of each via wiring 32 is substantially flush with the upper surface 30A of the insulation layer 30. In the same manner as the upper surface 30A of the insulation layer 30, the upper end surface 32A of each via wiring 32 is a smooth surface (low roughness surface) having few irregularities. For example, the upper end surface 32A of each via wiring 32 is a polished surface. The upper end surface 32A of each via wiring 32 has a roughness set to, for example, a surface roughness Ra value of approximately 15 to 40 nm.

The lower end surface of each via wiring 32 is directly connected to part of the upper surface 31T of the wiring layer 31. That is, the lower end surface of each via wiring 32 is connected to part of the upper surface 31T of the wiring layer 31, and the wiring layer 31 is electrically connected to the via wirings 32. In other words, the wiring layer 31 is electrically connected to the via wirings 32 and formed separately from, not integrally with, the via wirings 32. For example, copper or a copper alloy may be used as the material of the via wirings 32.

The solder resist layer 22 is laminated on the lower surface 30B of the insulation layer 30 to cover the wiring layer 31. The solder resist layer 22 is a protective insulation layer formed on the outermost layer (lowermost layer) of the wiring substrate 20.

The solder resist layer 22, for example, partially covers the lower surface 31L of the wiring patterns 31A. Further, the solder resist layer 22 entirely covers, for example, the lower surface 31L of the conductor patterns 31B.

The solder resist layer 22 includes openings 22X that expose parts of the wiring layer 31 (in the present example, wiring patterns 31A), which is the lowermost wiring layer, as the external connection pads P1.

A surface-processed layer 25 is formed on the wiring patterns 31A exposed from the openings 22X (i.e., on external connection pads P1) when necessary. For example, an anti-oxidation process such as the Organic Solderability Preservative (OSP) process may be performed on the surface of each external connection pad P1 to form an OSP film that serves as the surface-processed layer 25. An organic coating of an azole compound or an imidazole compound may be used as the OSP film. Other examples of the surface-processed layer 25 includes a gold (Au) layer, a nickel (Ni) layer/Au layer (metal layer in which Ni layer is bottom layer and Au layer is laminated on Ni layer), a Ni layer/palladium (Pd) layer/Au layer (metal layer in which Ni layer is bottom layer and Ni layer, Pd layer, and Au layer are laminated in this order). The Au layer is a metal layer of Au or Au alloy, the Ni layer is a metal layer of Ni or Ni alloy, and the Pd layer is a metal layer of Pd or Pd alloy. A metal layer (electroless plating metal layer) formed in an electroless plating process may be used as the Ni layer, the Au layer, and the Pd layer. The wiring patterns 31A exposed from the openings 22X may be used as the external connection terminals. Alternatively, the surface-processed layer 25 formed on the wiring patterns 31A may be used as the external connection terminals.

The openings 22X and the external connection pads P1 may have any planar shape and size. For example, the openings 22X and the external connection pads P1 may have a circular planar shape having a diameter of approximately 100 to 150 μm. Further, the external connection pads P1 may be arranged at a pitch of, for example, approximately 200 to 300 μm. For example, a photosensitive insulative resin of which the main component is phenol resin or polyimide resin may be used as the material of the solder resist layer 22. The solder resist layer 22 may include, for example, a filler such as silica, alumina, or the like. The solder resist layer 22 may have a thickness of, for example, approximately 15 to 25 μm.

The wiring structure 23 will now be described. As illustrated in FIG. 1A, the wiring structure 23 is laminated on the upper surface 30A of the insulation layer 30. The wiring structure 23 is a high-density wiring layer with wirings laid out at a higher density than the wiring structure 21.

The wiring structure 23 has a structure in which an insulation layer 40, a wiring layer 41, an insulation layer 42, a wiring layer 43, an insulation layer 44, and a wiring layer 45 are sequentially laminated on the upper surface 30A of the insulation layer 30.

For example, an insulative resin of which the main component is a photosensitive resin such as phenol resin or polyimide resin may be used as the material of the insulation layers 40, 42, and 44. The insulation layers 40, 42, and 44 may include, for example, a filler such as silica, alumina, or the like. For example, copper or copper alloy may be used as the material of the wiring layers 41, 43, and 45.

Each of the insulation layers 40, 42, and 44 has a thickness that is smaller than the thickness of the insulation layer 30 of the wiring structure 21. The thickness of each of the insulation layers 40, 42, and 44 may be, for example, approximately 3 to 10 μm. Each of the wiring layers 41, 43, and 45 has a thickness that is smaller than the thickness of the wiring layer 31 of the wiring structure 21. The wiring layers 41, 43, and 45 are respectively formed on the insulation layers 40, 42, and 44. The thickness of each of the wiring layers 41 and 43 may be, for example, approximately, 1 to 5 μm. The thickness of the wiring layer 45 may be, for example, approximately, 5 to 10 μm. The wiring width and wiring interval of each of the wiring layers 41, 43, and 45 are smaller than the wiring width and wiring interval of the wiring layer 31 of the wiring structure 21. The wiring layers 41, 43, and 45 each have a line-and-space (L/S) of, for example, approximately, 2 μm/2 μm to 3 μm/3 μm.

The insulation layer 40 is formed on the upper surface 30A of the insulation layer 30 covering the upper end surface 32A of each via wiring 32. The insulation layer 40 includes through holes 40X extending through the insulation layer 40 in the thickness-wise direction at given locations and exposing part of the upper end surface 32A of each via wiring 32.

As illustrated in FIG. 1B, the wiring layer 41 is formed on the upper surface of the insulation layer 40 and electrically connected to the via wirings 32. The wiring layer 41 includes via wirings 46, which fill the through holes 40X, and wiring patterns 47, which are formed on the upper surface of the insulation layer 40. The via wirings 46 each have a lower end surface that is directly connected to part of the upper end surface 32A of the corresponding via wiring 32. That is, the lower end surface of each via wiring 46 is partially in contact with the upper end surface 32A of the corresponding via wiring 32. Thus, the via wirings 32 are electrically connected to the via wirings 46. In other words, the via wirings 32 are electrically connected to the via wirings 46 and formed separately from, not integrally with, the via wirings 46.

The via wirings 46 include, for example, a seed layer 50 and a metal layer 51. The seed layer 50 covers the wall surfaces of the through holes 40X. The metal layer 51 is formed in the through holes 40X, the wall surfaces of which are covered by the seed layer 50. The wiring patterns 47 include, for example, the seed layer 50 that is formed on the upper surface of the insulation layer 40 and a metal layer 52 that is formed on both of the seed layer 50 and the metal layer 51. In this manner, the metal layers 51 and 52 are connected by the seed layer 50 to the via wirings 32.

The seed layer 50 continuously covers the wall surfaces of the through holes 40X (i.e., wall surfaces of through holes 40X and upper end surfaces 32A of via wiring 32 exposed from bottom portions of through holes 40X) and the upper surface of the insulation layer 40. As the seed layer 50, a metal film (sputter film) formed through sputtering may be used. For example, a metal film formed through sputtering and having a dual-layer structure may be used as the seed layer 50. The metal film of a dual-layer structure may include, for example, a titanium (Ti) layer, which is laminated on the wall surfaces of the through holes 40X and the upper surface of the insulation layer 40, and a copper (Cu) layer, which is laminated on the Ti layer. In this case, the Ti layer may have a thickness of, for example, approximately 10 to 50 nm, and the Cu layer may have a thickness of, for example, approximately, 100 to 500 nm. The Ti layer functions as a metal barrier layer that limits the diffusion of copper from the Cu layer or the metal layers 51 and 52 (e.g., Cu layer) to the insulation layer 40 or the like. Further, the Ti layer functions as an adhesion layer that improves adhesion between the insulation layer 40 and the seed layer 50. Titanium nitride (TiN), tantalum nitride (TaN), tantalum (Ta), chromium (Cr), or the like in lieu of Ti may be used as the material of the metal film functioning as such a metal barrier layer and an adhesion layer.

The metal layer 51 fills the through holes 40X, the wall surfaces of which are covered by the seed layer 50. The metal layer 52 covers the upper surface of the seed layer 50, which is formed on the insulation layer 40, and the metal layer 51. For example, a metal layer (electrolytic plating metal layer) formed in an electrolytic plating process may be used as the metal layers 51 and 52. For example, copper or copper alloy may be used as the material of the metal layers 51 and 52. The metal layer 52 may have a thickness of, for example, approximately 1 to 4 μm.

As illustrated in FIG. 1A, the insulation layer 42 is formed on the upper surface of the insulation layer 40 to cover the wiring layer 41. The insulation layer 42 includes through holes 42X that extend through the insulation layer 42 in the thickness-wise direction at given locations and expose parts of the upper surface of the wiring layer 41.

The wiring layer 43 is formed on the upper surface of the insulation layer 42. The wiring layer 43 is electrically connected to the wiring layer 41. The wiring layer 43 includes via wirings that fill the through holes 42X and wiring patterns that are formed on the upper surface of the insulation layer 42.

The insulation layer 44 is formed on the upper surface of the insulation layer 42 to cover the wiring layer 43. The insulation layer 44 includes through holes 44X that extend through the insulation layer 44 in the thickness-wise direction at given locations and expose parts of the upper surface of the wiring layer 43.

Each of the through holes 40X, 42X, and 44X is tapered so that the diameter decreases from the upper side as viewed in FIG. 1A (side closer to wiring layer 45) toward the lower side (side closer to wiring structure 21). For example, the through holes 40X, 42X, and 44X each have the shape of a reversed truncated cone so that the diameter of the upper open end is larger than the diameter of the lower open end. The diameter at the upper open end of each of the through holes 40X, 42X, and 44X may be, for example, approximately 5 to 10 μm.

The wiring layer 45 is formed on the upper surface 44A of the insulation layer 44. The wiring layer 45 is electrically connected to the wiring layer 43. The wiring layer 45 includes via wirings that fill the through holes 44X and connection terminals P2 that project upward from the upper surface 44A of the insulation layer 44. The connection terminals P2 are, for example, columnar connection terminals (metal posts) extending upward from the upper surface 44A of the insulation layer 44. The connection terminals P2 may have any planar shape and size. For example, the connection terminals P2 may each have a circular planar shape of which the diameter is approximately 20 to 25 μm. The connection terminals P2 may be arranged at a pitch of, for example, 40 to 50 μm. The connection terminals P2 function as electronic component mounting pads that are electrically connected to electronic components such as the semiconductor chips 60.

A surface-processed layer may be formed on the surface of each connection terminal P2 (both of upper and side surfaces or only upper surface) when necessary. The surface-processed layer may be, for example, similar to the surface-processed layer 25 formed on the external connection pads P1.

A volume percentage V1 of the wiring layer 31 and the via wirings 32 occupying the wiring structure 21 is set to a value that is greater than or equal to a volume percentage V2 of the wiring layers 41, 43, and 45 occupying the wiring structure 23. A ratio V1/V2 of the volume percentage V1 to the volume percentage V2 is preferably in the range from 1.0 to 1.4 and further preferably in the range from 1.0 to 1.14. When the ratio V1/V2 is set to a value in this range, warping of the wiring substrate 20 and the semiconductor device 10 is reduced in a preferred manner. This will be described later in detail when simulating warping.

The volume percentage V1 is the percentage of the volume of all of the metal layers included in the wiring structure 21 (i.e., wiring layer 31 and via wirings 32) with respect to the entire volume of the wiring structure 21. The volume percentage V2 is the percentage of the volume of all of the metal layers included in the wiring structure 23 (i.e., wiring layers 41, 43, and 45) with respect to the entire volume of the wiring structure 23. The ratio V1/V2 may be set to a desired value, for example, by adjusting the region where the conductor patterns 31B are formed and/or adjusting the thickness of at least one of the wiring layer 31, 41, 43, and 45.

The solder resist layer 24 is laminated on the upper surface 44A of the insulation layer 44 that is the uppermost layer of the wiring structure 23. The solder resist layer 24 is a protective insulation layer formed on the outermost layer (uppermost layer) of the wiring substrate 20.

The solder resist layer 24 is frame-shaped and formed to surround, for example, a chip-mounting region where one or more (two in this case) semiconductor chips 60 are mounted. In other words, the solder resist layer 24 includes an opening 24X exposing the wiring layer 45 and the insulation layer 44 that are located in the chip-mounting region.

For example, a photosensitive insulative resin of which the main component is phenol resin or polyimide resin may be used as the material of the solder resist layer 24. The solder resist layer 24 may include, for example, a filler such as silica, alumina, or the like. The solder resist layer 24 may have a thickness that is set to be, for example, the same as that of the solder resist layer 22. For example, the thickness of the solder resist layer 24 may be approximately 15 to 25 μm.

The semiconductor chips 60 are flip-chip-mounted on the wiring substrate 20. In the present example, the semiconductor chips 60 each include a circuit-formation surface (lower surface in this case) with connection terminals 61 that are bonded by bonding members 62 to the connection terminals P2 of the wiring substrate 20. This electrically connects the semiconductor chip 60 via the connection terminals 61 and the bonding members 62 to the wiring layer 45.

For example, logic chips such as Central Processing Unit (CPU) chips or Graphics Processing Unit (GPU) chips may be used as the semiconductor chips 60. Further, for example, memory chips such as Dynamic Random Access Memory (DRAM) chips, Static Random Access Memory (SRAM) chips, or flash memory chips may be used as the semiconductor chips 60. The semiconductor chips 60 that are a combination of a logic chip and a memory chip may be mounted on the wiring substrate 20. The semiconductor chips 60 may each have a thickness of, for example, approximately 50 to 100 μm.

For example, metal posts may be used as the connection terminals 61. The connection terminals 61 are columnar connection terminals extending downward from the circuit-formation surface of each semiconductor chip 60. In the present example, the connection terminals 61 are, for example, cylindrical. For example, copper or copper alloy may be used as the material of the connection terminals 61. In lieu of metal posts, for example, metal bumps such as gold bumps may be used as the connection terminals 61.

The bonding members 62 are bonded to the connection terminals 61 and the wiring layer 45. For example, a tin (Sn) layer or a lead-free (Pb-free) solder plating layer may be used as the bonding members 62. For example, lead-free solder that is based on Sn-silver (Ag), Sn—Cu, or Sn—Ag—Cu may be used as the material of the solder plating.

The encapsulation resin 70 is laminated on the upper surface 44A of the insulation layer 44, which is the uppermost insulation layer of the wiring substrate 20, to encapsulate the semiconductor chips 60. The encapsulation resin 70 covers the circuit-formation surface (lower surface) of each semiconductor chip 60, the upper surface 44A of the insulation layer 44, the solder resist layer 24, the wiring layer 45, the connection terminals 61, and the bonding members 62. In the present example, the encapsulation resin 70 exposes a back surface (upper surface as viewed in FIG. 1A) of each semiconductor chip 60 that is located at the side opposite to the circuit-formation surface. The upper surface of the encapsulation resin 70 is formed to be flush with the back surface (upper surface) of each semiconductor chip 60.

For example, an insulative resin having higher mechanical strength (rigidity, hardness, or the like) than photosensitive resin may be used as the material of the encapsulation resin 70. For example, a non-photosensitive insulative resin of which the main component is a thermosetting resin may be used as the material of the encapsulation resin 70. An insulative resin such as an epoxy resin or a polyimide resin may be used as the material of the encapsulation resin 70. Alternatively, a resin material mixing an epoxy resin or a polyimide resin with a filler such as silica or alumina may be used as the material of the encapsulation resin 70. For example, a resin mold may be used as the encapsulation resin 70. The encapsulation resin 70 may have a thickness of, for example, approximately 100 to 200 μm.

The operation of the wiring substrate 20 and the semiconductor device 10 will now be described with reference to FIGS. 1A and 1B.

In the wiring substrate 20, the solder resist layer 22 is formed on one side of the wiring structure 21, and the wiring structure 23 (high-density wiring layer) and the solder resist layer 24 are formed on the other wide of the wiring structure 21. Accordingly, the wiring substrate 20 is constructed so that the upper side of the wiring substrate 21 (i.e., upper structural body including wiring structure 23 and solder resist layer 24) is asymmetric to the lower side of the wiring structure 21 (i.e., lower structural body including solder resist layer 22). In the wiring substrate 20, the highly rigid glass cloth 30G is located closer to the wiring structure 23 than the thickness-wise center C1 of the insulation layer 30 in the wiring structure 21. Further, the glass cloth 30G is located at the thickness-wise center of the thickness T3 from the lower surface 30B of the insulation layer 30 to the upper surface of the wiring layer 45. In this manner, the thickness of each member in the wiring substrate 20 is set so that the thickness from the lower surface of the glass cloth 30G to the lower surface 30B of the insulation layer 30 is equal to the thickness from the upper surface of the glass cloth 30G to the upper surface of the wiring layer 45. This allows the highly rigid glass cloth 30G to be located near the thickness-wise center of the wiring substrate 20. Thus, when viewing the wiring substrate 20 in the vertical direction (thickness-wise direction), the wiring substrate 20 is constructed to be nearly symmetric at the upper and lower sides of the glass cloth 30G. As a result, the wiring substrate 20 is constructed to resist warping, and warping of the wiring substrate 20 is reduced in a preferred manner.

A method for manufacturing the semiconductor device 10 will now be described. The description hereafter will focus on a single semiconductor device 10. Actually, a batch of structures that will become the semiconductor devices 10 will be formed on a large substrate. Then, each semiconductor device 10 is singulated from the large substrate.

Figure 3A:

Referring to FIG. 3A, a support substrate 100 is prepared. A metal plate or a metal foil plate is used as the support substrate 100. The support substrate 100 of the present example uses a copper foil substrate obtained by joining an extremely thin copper foil of approximately to 2 to 5 μm and a support body copper foil of approximately 35 to 70 μm with a delamination layer arranged in between.

A metal film 101 is formed on the upper surface of the support substrate 100 entirely covering the upper surface of the support substrate 100. For example, the metal film 101 is formed on the upper surface of the extremely thin copper foil of the support substrate 100. The metal film 101 may be formed by performing, for example, sputtering, electrolytic plating, or vapor deposition. The material of the metal film 101 may be a conductive material functioning as a stopper layer when etching and removing the support substrate 100. Further, the material of the metal film 101 may be a conductive material that allows for selective etching and removal of the metal film 101 from the wiring layer 31 in a subsequent step. Such a material of the metal film 101 may be, for example, a metal such as titanium (Ti), Ni, chromium (Cr), or Sn or an alloy including at least one of these metals. In the present example, Ti is used as the material of the metal film 101. The metal film 101 may have a thickness of, for example, approximately 10 to 50 nm.

A seed layer 102 is formed on the upper surface of the metal film 101 entirely covering the upper surface of the metal film 101. The seed layer 102 may be formed by performing, for example, sputtering, electrolytic plating, or vapor deposition. For example, copper or copper alloy may be used as the material of the seed layer 102. The seed layer 102 may have a thickness of, for example, approximately 100 to 500 nm.

Figure 3B:
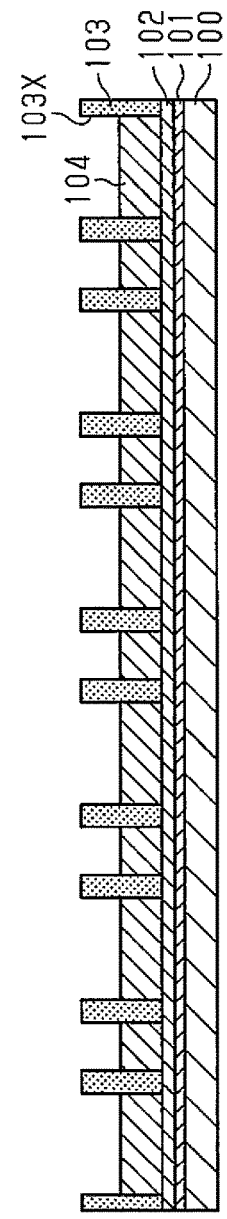

In the step of FIG. 3B, a resist layer 103 including an opening pattern 103X is formed on the upper surface of the seed layer 102. The opening pattern 103X exposes the upper surface of the seed layer 102 at portions corresponding to the formation regions of the wiring layer 31 (refer to FIG. 1A). The material of the resist layer 103 may be resistant to plating formed in the following plating process. For example, the material of the resist layer 103 may be a photosensitive dry film resist or a liquid photoresist. Such a resist material may be, for example, a novalac resin, an acrylic resin, or the like. For example, when using a photosensitive dry film resist, thermocompression bonding is performed to laminate a dry film on the seed layer 102, and the dry film is patterned in a photolithography process to form the resist layer 103 including the opening pattern 103X. When using a liquid photoresist, similar processes are performed to form the resist layer 103.

Electrolytic plating (electrolytic copper plating) using the resist layer 103 as a plating mask and the seed layer 102 as a plating power supply layer is performed to form a metal layer 104 on the upper surface of the seed layer 102 exposed from the opening pattern 103X of the resist layer 103.

Figure 3C:
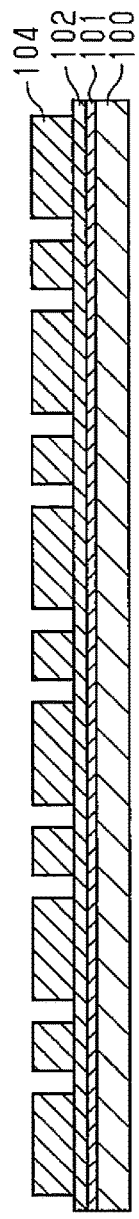

In the step of FIG. 3C, the resist layer 103 illustrated in FIG. 3B is removed using, for example, an alkali delamination liquid (e.g., an organic amine delamination liquid, caustic soda, acetone, or ethanol).

Figure 3D:
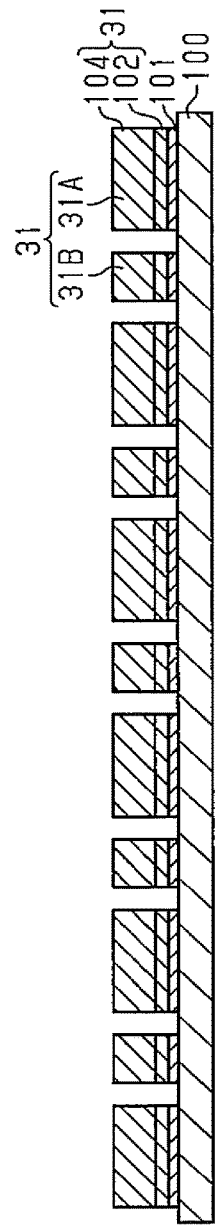

In the step of FIG. 3D, etching (e.g., wet etching) is performed using the metal layer 104 as an etching mask to remove unnecessary portions from the seed layer 102. The etching liquid for wet etching may be, for example, an acid aqueous solution such as a piranha solution (mixed aqueous solution of sulfuric acid and hydrogen peroxide). This etching step is performed to form the wiring layer 31, which includes the seed layer 102 and the metal layer 104, on the upper surface of the metal film 101. As a result, the wiring patterns 31A and the conductor patterns 31B, which are laid out in regions where the wiring patterns 31A are not laid out, is formed on the upper surface of the metal film 101.

Then, the metal film 101 is etched and removed using the wiring layer 31 as an etching mask. For example, when Ti is used as the material of the metal film 101, the metal film 101 may be selectively etched by performing dry etching using an etching gas such as tetrafluoromethane ($CF_4$) or wet etching using a potassium hydroxide (KOH) etching liquid. The selective etching removes unnecessary portions from the metal film 101 without etching the wiring layer 31 and the support substrate 100 (Cu layer). Here, the support substrate 100 functions as a stopper layer when etching the metal film 101.

Hereafter, in FIGS. 4A to 9B, the seed layer 102 and the metal layer 104 are not illustrated. The seed layer 102 and the metal layer 104 are illustrated as the wiring layer 31.

In the step of FIG. 4A, the insulation layer 30 is formed on the upper surface of the support substrate 100 entirely covering the upper surface 31T and side surfaces 31S of the wiring layer 31 and entirely covering the side surfaces of the metal film 101. The insulation layer 30 may be formed by, for example, laminating a resin film on the metal film 101 and then performing a heat treatment at a temperature of 130° C. to 200° C. while pressing the resin film to harden the resin film. The resin film may be obtained by impregnating the glass cloth 30G, which is a reinforcement material, with a thermosetting resin such as an epoxy resin. In the insulation layer 30 formed in the step of FIG. 4A, the upper surface of the glass cloth 30G is covered by the resin layer 34, and the lower surface of the glass cloth 30G is covered by the resin layer 35 that has the same thickness as the resin layer 34. Thus, the glass cloth 30G is located proximate to the thickness-wise center of the insulation layer 30. In the step of FIG. 4A, the thickness from the center of the glass cloth 30G to the upper surface of the resin layer 34 may be, for example, approximately 20 to 25 μm, and the thickness from the center of the glass cloth 30G to the lower surface of the resin layer 35 may be, for example, approximately 20 to 25 μm.

Further, in the step of FIG. 4A, the recesses 30X are formed in the insulation layer 30 to accommodate the wiring layer 31 and the metal film 101. The wiring layer 31 and the metal film 101 are formed on the bottom surfaces of the recesses 30X.

In the step of FIG. 4B, the through holes 30Y are formed in the insulation layer 30 at given locations to expose portions of the upper surface 31T of the wiring layer 31. The through holes 30Y are formed through, for example, laser drilling using a $CO_2$ laser, a UV-YAG laser, or the like.

When forming the through holes 30Y through laser drilling, a desmearing process is performed to remove resin smears from the surface of the wiring layer 31 exposed at the bottom portions of the through holes 30Y. The desmearing process roughens the wall surfaces of the through holes 30Y and the upper surface 30A of the insulation layer 30.

In the step of FIG. 4C, a seed layer (not illustrated) is formed entirely covering the surface of the insulation layer 30, which includes the wall surfaces of the through holes 30Y, and the upper surface 31T of the wiring layer 31 exposed from the through holes 30Y. Then, electrolytic plating is performed using the seed layer as a power supplying layer. For example, the seed layer is formed by performing electroless copper plating, and electrolytic copper plating is performed using the seed layer as a power supplying layer. This fills the through holes 30Y with a conductive layer 105 that entirely covers the upper surface 30A of the insulation layer 30.

Then, for example, Chemical Mechanical Polishing (CMP) or the like is performed to polish the conductive layer 105 that project from the upper surface 30A of the insulation layer 30 and portions of the upper surface 30A of the insulation layer 30 that are roughened portions. As illustrated in FIG. 5A, this forms the via wirings 32 with which the through holes 30Y are filled with, and the upper end surface 32A of each via wiring 32 is formed to be substantially flush with the upper surface 30A of the insulation layer 30. The upper surface 30A of the insulation layer 30 is partially polished to smooth the upper surface 30A of the insulation layer 30. For example, the roughness of the upper surface 30A of the insulation layer 30 prior to polishing has a surface roughness Ra value of approximately 300 to 400 nm, whereas the roughness of the polished upper surface 30A of the insulation layer 30 may have a surface roughness Ra value of approximately 15 to 40 nm. In other words, in the step of FIG. 5A, the upper surface 30A of the insulation layer 30 is polished to smooth the upper surface 30A of the insulation layer 30 (for example, so that the surface roughness Ra value becomes approximately 15 to 40 nm). The wall surfaces of the through holes 30Y remain roughened. Thus, the upper surface 30A of the insulation layer 30 has a smaller surface roughness than the inner surface of the through holes 30Y. The polishing step results in the upper surface 30A of the insulation layer 30 and the upper end surface 32A of each via wiring 32 being polished surfaces.

Further, as described above, the upper surface 30A of the insulation layer 30 is partially polished to reduce the thickness of the resin layer 34 in the insulation layer 30, which covers the upper surface of the glass cloth 30G. Thus, the thickness of the resin layer 34 becomes less than the thickness of the resin layer 35, which covers the lower surface of the glass cloth 30G. As a result, the glass cloth 30G that was located proximate to the thickness-wise center of the insulation layer 30 becomes located toward the upper side (toward upper surface 30A of insulation layer 30) from the thickness-wise center of the insulation layer 30. In the present example, the insulation layer 30 is polished so that the glass cloth 30G is not exposed from the resin layer 34.

The removed amount of the insulation layer 30 (resin layer 34) may be, for example, approximately 5 to 10 μm. Thus, the thickness of the polished resin layer 34 is, for example, approximately, 10 to 15 μm.

In the CMP process of the present example, when, for example, polishing the conductive layer 105 (refer to FIG. 4C) formed on the upper surface 30A of the insulation layer 30, the slurry material, the polishing pad hardness, or the like are adjusted so that the polishing amount of the conductive layer 105 (metal) is greater than the polishing amount of the insulation layer 30 (resin). Further, in the CMP process of the present example, the slurry material, the polishing pad hardness, or the like are adjusted after exposing the upper surface 30A of the insulation layer 30. For example, after exposing the upper surface 30A of the insulation layer 30, the slurry material, the polishing pad hardness, or the like are adjusted so that the polishing amount of the insulation layer 30 (resin) becomes greater than the polishing amount of the conductive layer 105 (metal).

In the step of FIG. 5B, the insulation layer 40, which includes the through holes 40X exposing portions of the upper end surface 32A of each via wiring 32, is formed on the upper surface 30A of the insulation layer 30. For example, when using the insulation layer 40 as a resin film, the resin film is laminated in thermocompression bonding to the upper surface 30A of the insulation layer 30, and the resin film is patterned in a photolithography process to form the insulation layer 40. Alternatively, spin coating is performed to apply a liquid or paste of an insulation resin to the upper surface 30A of the insulation layer 30, and the insulative resin is patterned in a photolithography process to form the insulation layer 40.

The roughness of the upper surface 40A of the insulation layer 40, formed from an insulative resin of which the main component is a photosensitive resin, may have a surface roughness Ra value of approximately 2 to 10 nm. Accordingly, the upper surface 40A of the insulation layer 40 has a smaller surface roughness than the wall surfaces of the through holes 30Y and a smaller surface roughness than the upper surface 30A of the insulation layer 30 (polishing surface).

In the step of FIG. 5C, the seed layer 50 is formed entirely covering the wall surfaces of the through holes 40X (entire wall surface of each through hole 40X and entire upper end surface 32A of via wiring 32 exposed in each through hole 40X) and the upper surface 40A of the insulation layer 40. The seed layer 50 may be formed through, for example, sputtering or electroless plating.

When, for example, performing sputtering to form the seed layer 50, titanium (Ti) is sputtered and deposited on the upper surface 40A of the insulation layer 40 and the wall surfaces of the through holes 40X to form a Ti layer that covers the upper surface 40A of the insulation layer 40 and the wall surfaces of the through holes 40X. Then, copper is sputtered and deposited on the Ti layer to form a Cu layer. This forms the seed layer 50 that has a dual-layer structure (Ti layer/Cu layer). Further, when performing electroless plating to form the seed layer 50, for example, electroless copper plating may be performed to form the seed layer 50 that has a Cu layer (single-layer structure).

Figure 6A:
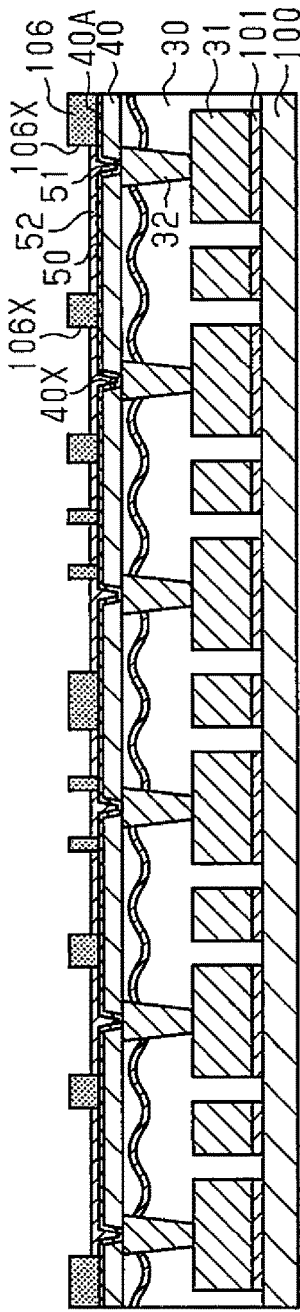

In the step of FIG. 6A, a resist layer 106 including opening patterns 106X at given locations is formed on the seed layer 50. The opening patterns 106X expose the seed layer 50 at portions corresponding to the formation regions of the wiring layer 41 (refer to FIG. 1A). The resist layer 106 may be formed from, for example, a material that will be resistant to plating formed in the following plating process. The resist layer 106 may be formed from, for example, the same material as the resist layer 103 (refer to FIG. 3B). Further, the resist layer 106 may be formed through the same process as the resist layer 103.

Then, electrolytic plating (in this case, electrolytic copper plating) is performed using the resist layer 106 as a plating mask and the seed layer 50 as a plating power supplying layer. This forms the metal layer 51 on the seed layer 50 in the through holes 40X exposed from the opening patterns 106X of the resist layer 106 and forms the metal layer 52 on the seed layer 50, which is formed on the upper surface 40A of the insulation layer 40.

Figure 6B:
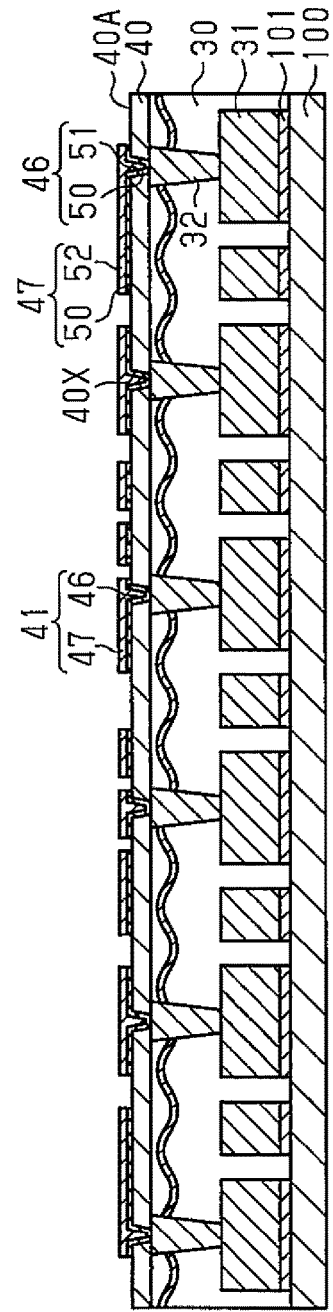

In the step of FIG. 6B, the resist layer 106 is removed with, for example, an alkali delamination liquid. Then, etching is performed to remove unnecessary portions from the seed layer 50 using the metal layers 51 and 52 as etching masks. For example, when the seed layer 50 is formed by a Ti layer/Cu layer, the Cu layer is removed by performing wet etching with a piranha solution-based etching liquid. Then, the Ti layer is removed by performing, for example, dry etching using an etching gas of $CF_4$ or the like or wet etching using a KOH-based etching liquid. Referring to FIG. 6B, such an etching step forms the via wirings 46, which include the seed layer 50 and the metal layer 51, in the through holes 40X. Further, the wiring patterns 47, which include the seed layer 50 and the metal layer 52, are formed on the upper surface 40A of the insulation layer 40. This forms the wiring layer 41 including the via wirings 46 and the wiring patterns 47. In this manner, the wiring layer 41 is formed through a semi-additive process. Hereafter, in FIGS. 6C to 9B, the seed layer 50 and the metal layers 51 and 52 are not illustrated, and the seed layer 50 and the metal layers 51 and 52 are illustrated as the wiring layer 41.

Figure 6C:
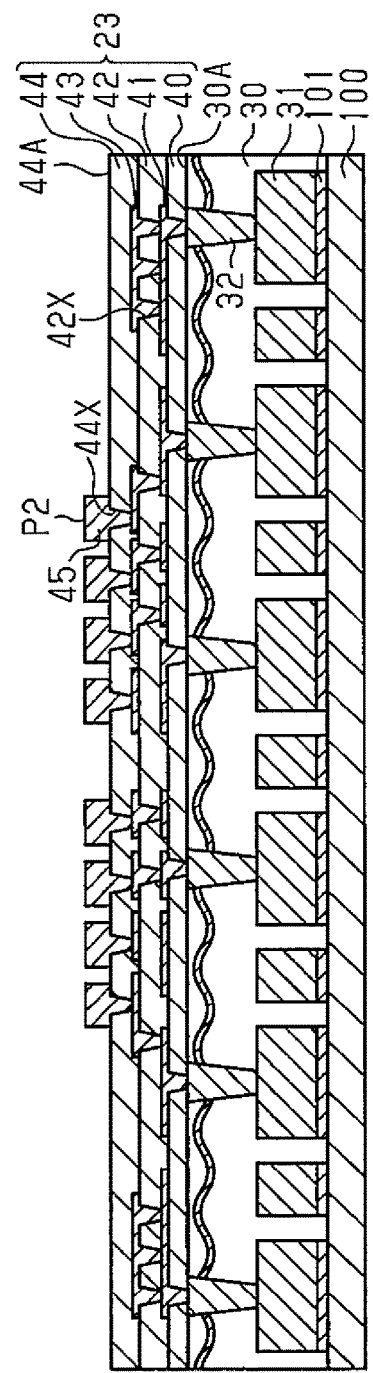

In the step of FIG. 6C, in the same manner as the step of FIG. 5B, the insulation layer 42, which includes the through holes 42X exposing portions of the upper surface of the wiring layer 41, is formed on the insulation layer 40. Then, in the same manner as the steps of FIGS. 5C to 6B, for example, a semi-additive process is performed to form the wiring layer 43 including via wirings, with which the through holes 42X are filled, and wiring patterns, which are electrically connected by the via wirings to the wiring layer 41 and laminated on the insulation layer 42.

In the same manner as the step of FIG. 5B, the insulation layer 44, which includes the through holes 44X that expose portions of the upper surface of the wiring layer 43, is formed on the insulation layer 42. Then, in the same manner as the steps of FIGS. 5C to 6B, for example, a semi-additive process is performed to form the wiring layer 45 including via wirings, with which the wiring layer 43 are filled, and the connection terminals P2, which are electrically connected by the via wirings to the wiring layer 43 and laminated on the upper surface 44A of the insulation layer 44. A surface-processed layer may be formed on the surface of each connection terminal P2 (both of upper and side surfaces or only upper surface) when necessary.

Figure 7A:
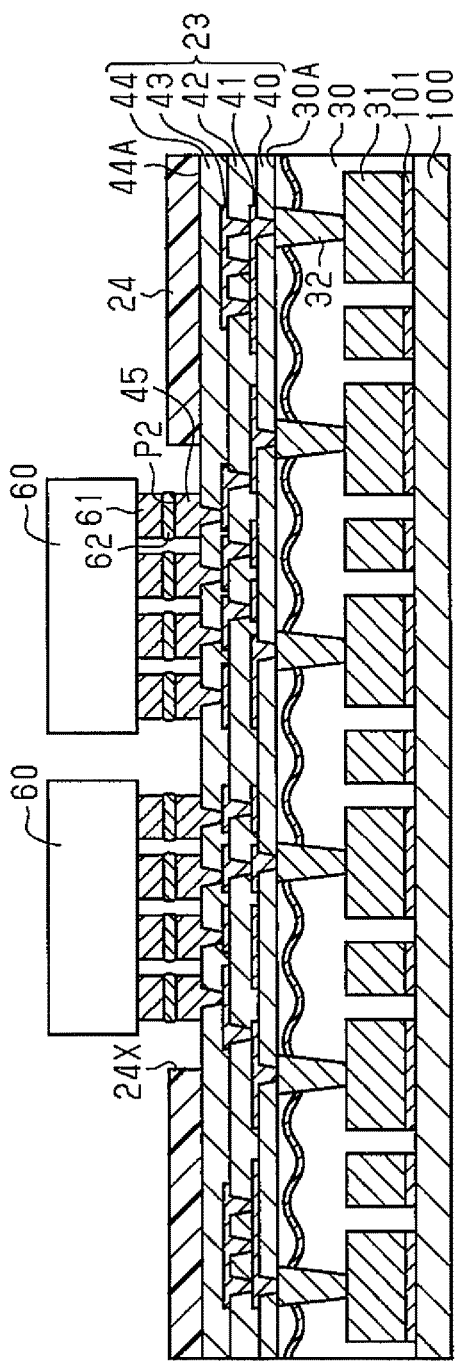

Then, in the step of FIG. 7A, the solder resist layer 24, which includes the opening 24X exposing the chip-mounting region, is laminated on the upper surface 44A of the insulation layer 44. The solder resist layer 24 may be formed by, for example, laminating a photosensitive solder resist film on or applying a liquid solder resist to the upper surface 44A of the insulation layer 44 and patterning the resist into a given shape.

Then, the semiconductor chips 60 are prepared including the connection terminals 61, which are formed on the circuit-formation surface, and the bonding members 62, which are formed on the lower surface of the connection terminals 61. The connection terminals 61 of the semiconductor chips 60 are flip-chip-bonded to the connection terminals P2 exposed in the opening 24X of the solder resist layer 24. For example, when the bonding members 62 are a solder layer, after aligning the connection terminals P2 with the connection terminals 61, a reflow process is performed to melt the bonding members 62 (solder layer) and electrically connect the connection terminals 61 to the connection terminals P2.

Figure 7B:
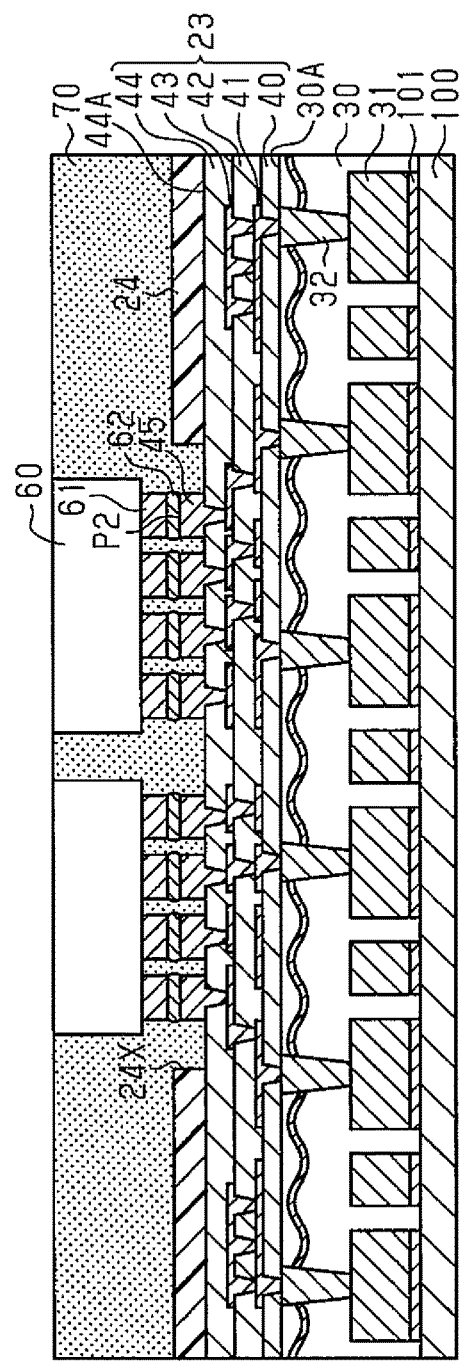

In the step of FIG. 7B, the encapsulation resin 70, which encapsulates the semiconductor chips 60, is formed on the upper surface 44A of the insulation layer 44. The encapsulation resin 70, for example, covers the side surfaces and circuit-formation surface of each semiconductor chip 60. The encapsulation resin 70 also covers the surfaces of the solder resist layer 24, the connection terminals P2 and 61, and the bonding members 62. In the present example, the encapsulation resin 70 exposes the back surface (upper surface) of each semiconductor chip 60. Instead, the encapsulation resin 70 may cover the back surface of each semiconductor chip 60.

For example, when using a thermosetting mold resin as the material of the encapsulation resin 70, the structure illustrated in FIG. 7A is set in a mold, the mold is pressurized (e.g., 5 to 10 MPa), and fluidized mold resin is charged into the mold. Then, the mold resin is heated and hardened at a temperature of approximately 180° C. to form the encapsulation resin 70. The mold resin is charged by undergoing transfer molding, compression molding, or injection molding.

Figure 8A:
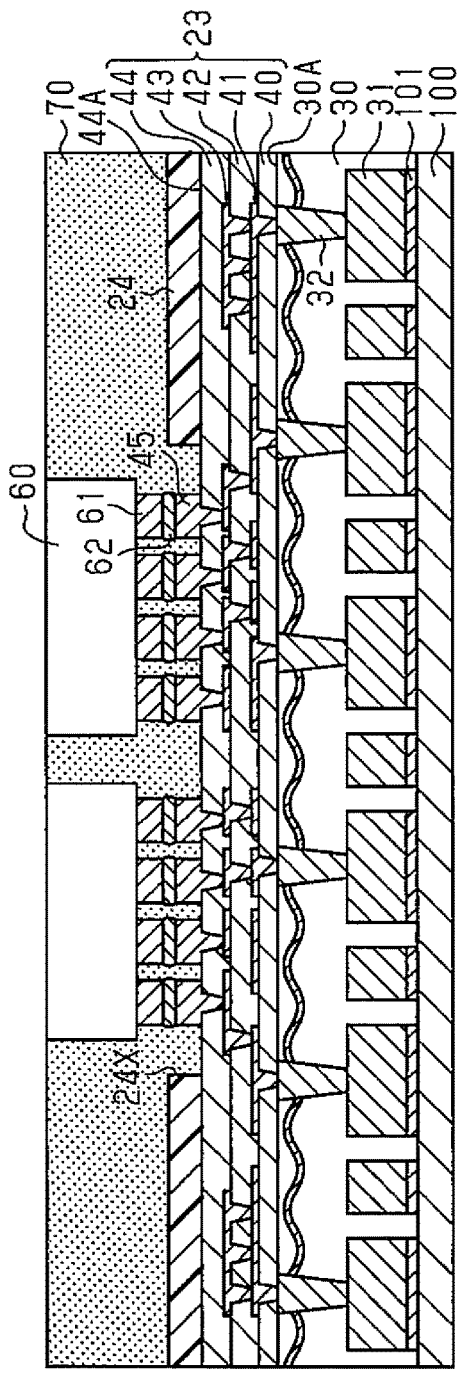

In the step of FIG. 8A, the semiconductor chips 60 and the encapsulation resin 70 are thinned from the upper side. For example, back-grinding or the like is performed to grind the upper surface of the encapsulation resin 70 and the back surface (upper surface) of the semiconductor chips 60 and thin the semiconductor chips 60 and the encapsulation resin 70. The thickness of each semiconductor chip 60 prior to thinning is, for example, approximately 700 to 1000 μm, whereas the thickness of each semiconductor chips 60 subsequent to thinning may be, for example, approximately, 200 to 300 μm. The thinning process results in the upper surface of the encapsulation resin 70 being substantially flush with the back surface of each semiconductor chip 60.

Figure 8B:
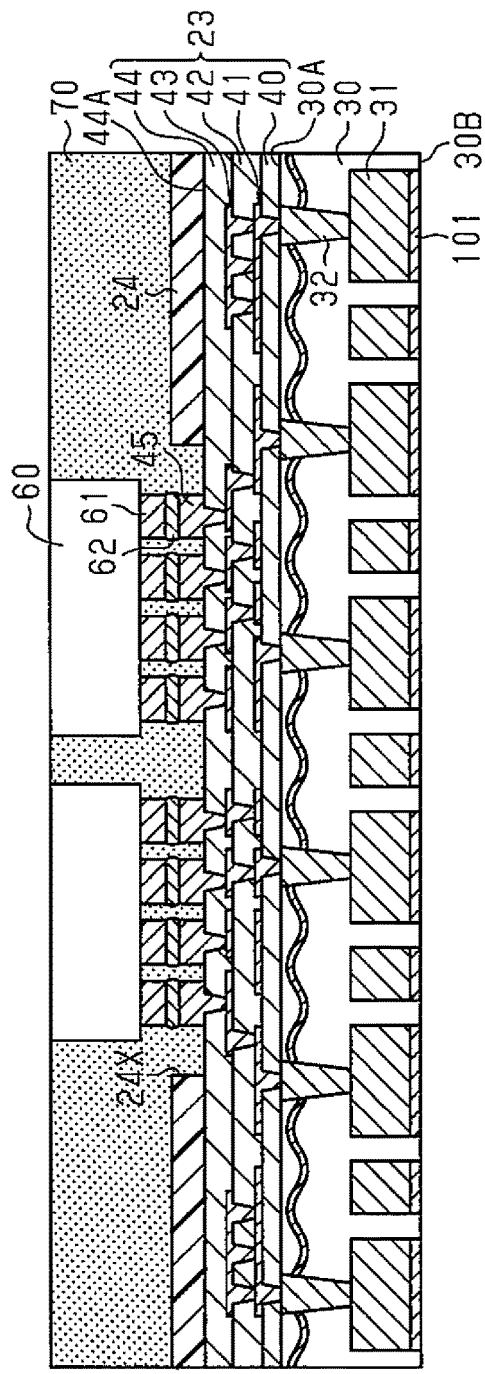

In the step of FIG. 8B, the support substrate 100 is removed. For example, the support body copper foil of the support substrate 100 is mechanically delaminated from the extremely thin copper foil. In the present example, the delamination layer is arranged between the support body copper foil and the extremely thin copper foil. Thus, the adhesive force is weak between the support body copper foil and the extremely thin copper foil. Consequently, the support body copper foil is easily delaminated from the extremely thin copper foil. Then, for example, wet etching is performed using aqueous solutions of ferric chloride, copper(II) chloride, ammonium persulfate, or the like to remove the residual extremely thin copper foil from the metal film 101 and the insulation layer 30. In this case, the metal film 101 and the insulation layer 30 function as a stopper layer when etching the extremely thin copper foil of the support substrate 100. Referring to FIG. 8B, the removal of the support substrate 100 exposes the lower surface of the metal film 101 and the lower surface 30B of the insulation layer 30 to the outside.

In the step of FIG. 9A, the metal film 101 illustrated in FIG. 8B is removed and the insulation layer 30 is thinned from the lower surface 30B. For example, dry etching (plasma etching) may be performed using an etching gas such as $CF_4$ to remove the metal film 101 and thin the insulation layer 30. In this case, the wiring layer 31 functions as a stopper layer when etching the metal film 101 (refer to FIG. 8B). The removal of the metal film 101 exposes the lower surface 31L of the wiring layer 31 to the outside. In the step of FIG. 9A, the insulation layer 30 is thinned from the lower surface 30B so that the lower surface 30B of the insulation layer 30 becomes flush with the lower surface 31L of the wiring layer 31.

In the step of FIG. 9B, the solder resist layer 22, which includes the openings 22X exposing portions of the lower surface 31L of the wiring layer 31, is laminated on the lower surface 30B of the insulation layer 30. The solder resist layer 22 may be formed by, for example, laminating a photosensitive solder resist film on or applying a liquid solder resist on the lower surface 30B of the insulation layer 30 and patterning the resist into a given shape. This exposes portions of the lower surface 31L of the wiring layer 31 from the openings 22X of the solder resist layer 22 as the external connection pads P1. Then, the surface-processed layer 25 (refer to FIG. 1A) is formed on the external connection pads P1 when necessary.

The semiconductor device 10 illustrated in FIGS. 1A and 1B may be manufactured through the manufacturing steps described above.

Warping Simulation

Figure 15:
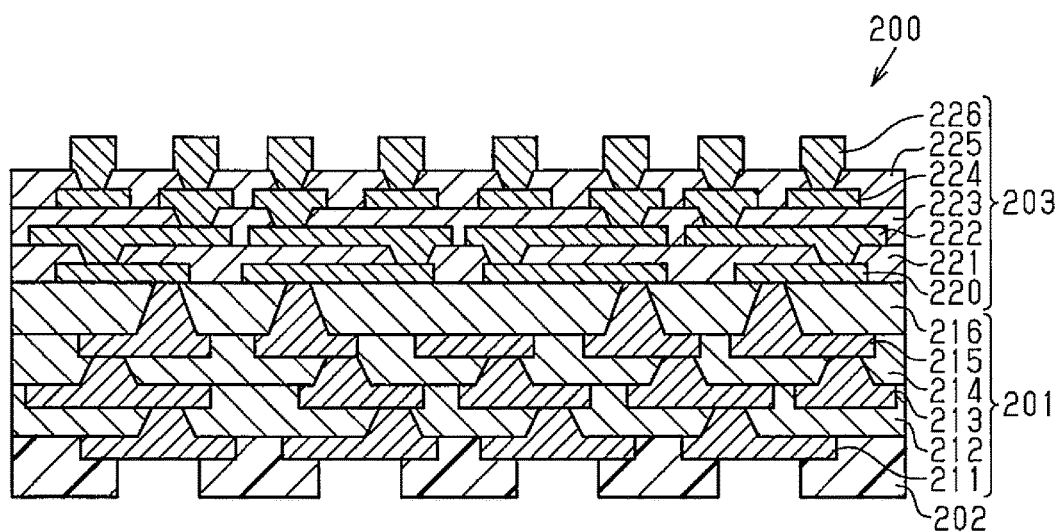
FIG. 15 is a schematic cross-sectional view illustrating a wiring substrate of the related art.

A warping simulation was performed on the wiring substrate 20 (example) illustrated in FIG. 1A, and the wiring substrate 200 of the related art illustrated in FIG. 15.

Simulation Conditions

In the wiring substrate 20 of the example, the thickness from the lower surface to the upper surface of the solder resist layer 22 was set to 22 μm, the thickness of the wiring layer 31 was set to 15 μm, and the thickness from the lower surface 30B of the insulation layer 30 to the upper surface 30A was set to 30 μm. Further, in the wiring substrate 20, the thickness from the lower surface to the upper surface of the insulation layer 40 was set to 5 μm, the thickness from the lower surface to the upper surface of each of the insulation layers 42 and 44 was set to 7 μm, the thickness of each of the wiring layers 41 and 43 was set to 2 μm, the thickness of the wiring layer 45 was set to 10 μm, and the thickness from the lower surface to the upper surface of the solder resist layer 24 was set to 22 μm. That is, the thickness of the entire wiring substrate 20 (i.e., thickness from lower surface of solder resist layer 22 to upper surface of wiring layer 45) was set to 81 μm. Further, the volume percentage V2 of the wiring layers 41, 43, and 45 occupying the wiring structure 23 was set to 70%. Warping simulations were performed on the wiring substrate 20 changing the volume percentage V1 of the wiring layer 31 and via wirings 32 occupying the wiring structure 21 to 0%, 10%, 20%, 30%, 40%, 50%, 60%, 70%, 80%, 90%, and 100%.

In the wiring substrate 200 of the comparative example, the thickness from the lower surface to the upper surface of the solder resist layer 202 was set to 35 μm, the thickness of each of the wiring layers 211, 213, and 215 was set to 15 μm, and the thickness from the lower surface to the upper surface of each of the insulation layers 212, 214, and 216 was set to 30 μm. Further, in the wiring substrate 200, the thickness of each of the wirings layers 220, 222, and 224 was set to 2 μm, the thickness from the lower surface to the upper surface of each of the insulation layers 221, 223, and 225 was set to 7 μm, and the thickness of the wiring layer 226 was set to 10 μm. That is, the thickness of the entire wiring substrate 200 (i.e., thickness from lower surface of solder resist layer 202 to upper surface of wiring layer 226) was set to 156 μm. In this manner, the thickness of the entire wiring substrate 200 in the comparative example was set to be 75 μm greater than the thickness of the entire wiring substrate 20 in the example. Warping simulations were performed on the wiring substrate 200 under the same conditions as the example.

Simulation Results

Figure 10:
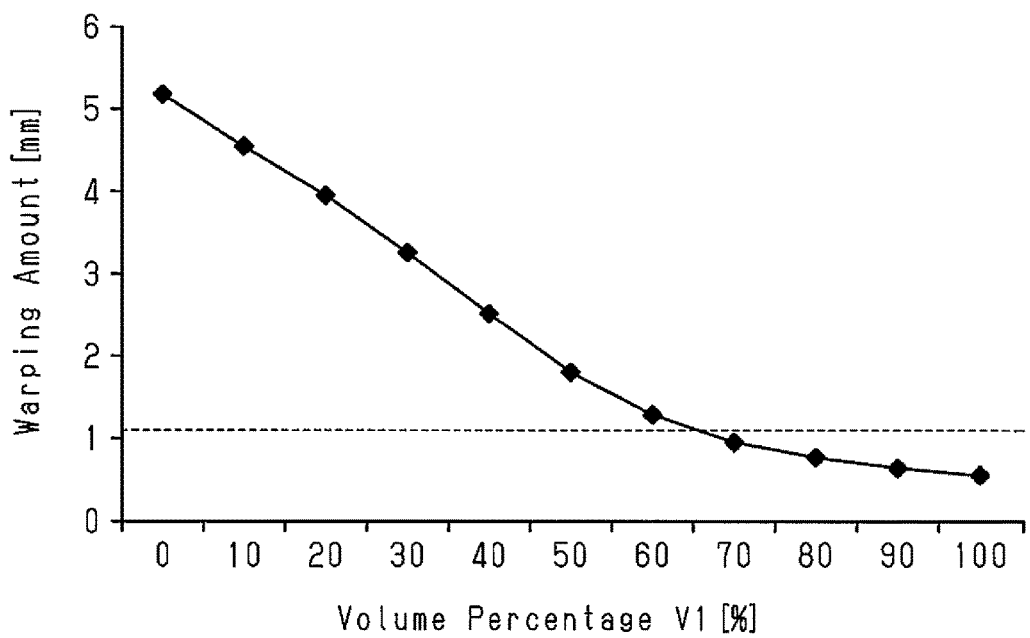
FIG. 10 is a graph illustrating a simulation result.

The simulation results are illustrated in FIG. 10. In FIG. 10, the warping amount indicated by the broken line (specifically, 1.13 mm) is the warping amount of the wiring substrate 200 in the comparative example. As illustrated in FIG. 10, in the wiring substrate 20 of the example, the warping amount decreased as the volume percentage V1 increased. As compared to the comparative example, in the present example, the warping amount of the wiring substrate 20 was decreased when setting the volume percentage V1 in the range from 70% to 100%. That is, the warping amount of the wiring substrate 20 was less than that of the comparative example when setting the ratio V1/V2 of the volume percentage V1 to the volume percentage V2 (70%) in the range from approximately 1.0 to 1.4. Furthermore, the warping amount of the wiring substrate 20 was less than that of the wiring substrate 200 in the comparative example that was set to be thicker than the wiring substrate 20 when setting the ratio V1/V2 of the volume percentages V1 and V2 in the range from 1.0 to 1.4.

When taking into account the layout of the via wirings 32 and the wiring layer 31, there is a limit to increasing the volume percentage V1. Thus, the volume percentage V1 is preferably set to 80% or less.

Accordingly, to effectively decrease the warping amount of the wiring substrate 20, it is preferred that the ratio V1/V2 of the volume percentage V1 relative to the volume percentage V2 be set in the range from 1.0 to 1.4 and further preferred that the ratio V1/V2 be set in the range from 1.0 to 1.14.

The present embodiment has the advantages described below.

(1) In the wiring substrate 20, the solder resist layer 22 is formed on one side of the wiring structure 21. The wiring structure 23 (high-density wiring layer) and the solder resist layer 24 are formed on the other side of the wiring structure 21. Accordingly, the wiring substrate 20 is constructed so that the upper side of the wiring structure 21 (i.e., upper structural body including wiring structure 23 and solder resist layer 24) is asymmetric to the lower side of the wiring structure 21 (i.e., lower structural body including solder resist layer 22). In the wiring substrate 20, the highly rigid glass cloth 30G is located toward the wiring structure 23 from the center C1 of the insulation layer 30 of the wiring structure 21 in the thickness-wise direction. This allows the highly rigid glass cloth 30G to be located closer to the thickness-wise center of the wiring substrate 20. Thus, when viewing the wiring substrate 20 in the vertical direction (thickness-wise direction), the wiring substrate 20 is constructed so that the upper and lower sides of the glass cloth 30G are symmetric. As a result, the wiring substrate 20 is constructed to resist warping, and warping of the wiring substrate 20 is reduced in a preferred manner.

(2) The glass cloth 30G is located at the thickness-wise center of the thickness T3 from the lower surface 30B of the insulation layer 30 to the upper surface of the wiring layer 45. This allows the highly rigid glass cloth 30G to be located closer to the thickness-wise center of the wiring substrate 20. Thus, the wiring substrate 20 is constructed to resist warping, and warping of the wiring substrate 20 is reduced in a preferred manner.

(3) The wiring substrate 20 has a coreless structure that does not include a core substrate (support substrate). Thus, in contrast with a wiring substrate that includes a core substrate, the thickness of the entire wiring substrate 20 and the thickness of the entire semiconductor device 10 may be reduced. As a result, warping of the wiring substrate 20 may be reduced while reducing the thickness of the wiring substrate 20.

(4) The wiring structure 21 includes a single insulation layer 30. Thus, the thickness of the entire wiring substrate 20 and the thickness of the entire semiconductor device 10 may be reduced from that of the wiring substrate 200 in the related art.

(5) The wiring layer 31 is embedded in the insulation layer 30. Thus, in comparison with when laminating the wiring layer 31 on the lower surface 30B of the insulation layer 30, the wiring substrate 20 and the semiconductor device 10 may be entirely reduced in thickness.

Further, the insulation resin of the insulation layer 30 is set to have a large thickness. Accordingly, the wiring layer 31 embedded in the insulation layer 30 may be increased in thickness. This increases the rigidity of the wiring structure 21 and reduces warping of the wiring substrate 20 in a preferred manner.

(6) The insulation layer 30 entirely covers the side surface 31S of the wiring layer 31. Thus, the thickness of the insulation layer 30 may be increased as compared with an insulation layer that partially covers the side surface 31S of the wiring layer 31. This increases the rigidity of the wiring structure 21 and reduces warping of the wiring substrate 20.

(7) The ratio V1/V2, which is the volume percentage V1 of the wiring layer 31 and the via wirings 32 occupying the wiring structure 21 to the volume percentage V2 of the wiring layers 41, 43, and 45 occupying the wiring structure 23, is set in the range from 1.0 to 1.4. This reduces warping of the wiring substrate 20 in a preferred manner.

It should be apparent to those skilled in the art that the foregoing embodiments may be implemented in many other specific forms without departing from the scope of this disclosure. Particularly, it should be understood that the foregoing embodiments may be implemented in the following forms.

In the above embodiment, the lower end surface of each via wiring 46 is directly connected to the upper end surface 32A of each via wiring 32. However, the wiring structure 23 is not limited to such a construction.

Figure 11:
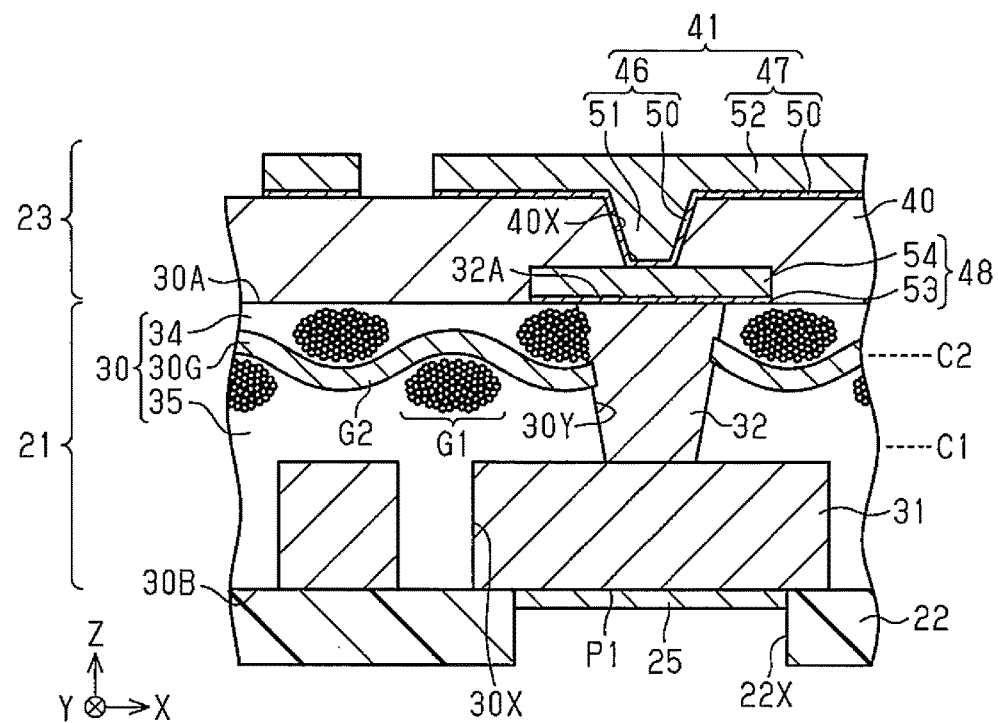
FIG. 11 is a partially enlarged cross-sectional view illustrating a modified example of the semiconductor device.

For example, as illustrated in FIG. 11, a wiring layer 48 that is connected to the upper end surface 32A of each via wiring 32 may be formed on the upper surface 30A of the insulation layer 30. In the example of FIG. 11, the upper end surface 32A of each via wiring 32 is connected to part of the lower surface of the wiring layer 48. This electrically connects the wiring layer 48 and the via wirings 32. In other words, the wiring layer 48 is electrically connected to the via wirings 32 and formed separately from, not integrally with, the via wirings 32.

For example, the wiring layer 48 includes a seed layer 53 that is formed on the upper surface 30A of the insulation layer 30 and the upper end surface 32A of each via wiring 32 and a metal layer 54 that is formed on the seed layer 53. The metal layer 54 is connected by the seed layer 53 to the via wirings 32. The seed layer 53 may be formed from the same material as the seed layer 50. The metal layer 54 may be formed from the same material as the metal layers 51 and 52. In this case, the via wirings 46 are connected to the upper surface of the wiring layer 48.

In the above embodiment, the lower surface 31L of the wiring layer 31 is flush with the lower surface 30B of the insulation layer 30. However, the lower surface 31L does not have to be flush with the lower surface 30B.

Figures 12A, 12B:
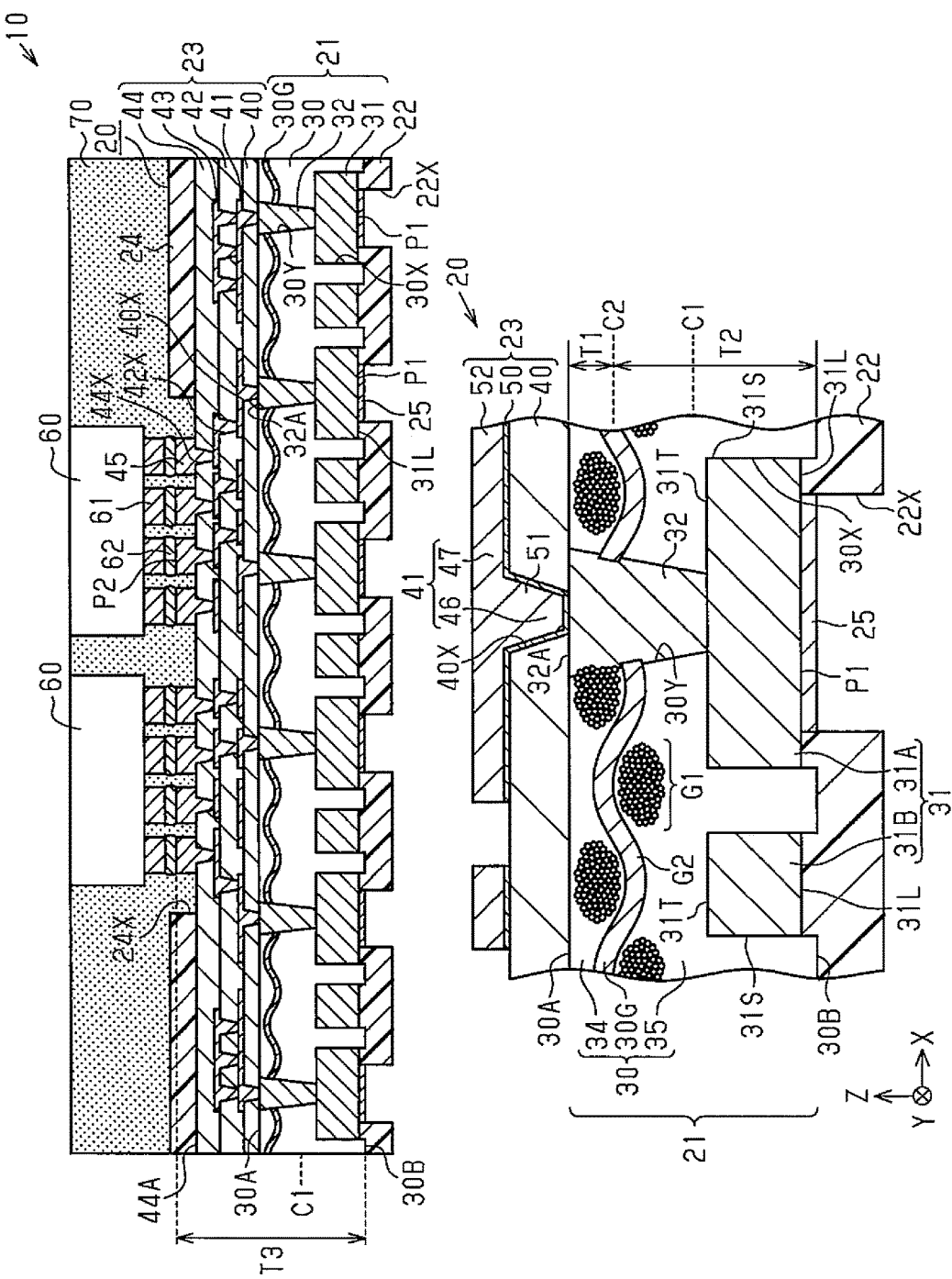
FIG. 12A is a schematic cross-sectional view illustrating another modified example of the semiconductor device.
FIG. 12B is an enlarged cross-sectional view of part of the semiconductor device illustrated in FIG. 12A.

For example, as illustrated in FIG. 12A, the lower surface 31L of the wiring layer 31 may be recessed from the lower surface 30B of the insulation layer 30 toward the wiring structure 23 (upward in FIG. 12A). In this modified example, the lower surface 31L of the wiring layer 31 is entirely located upward from the lower surface 30B of the insulation layer 30. In this case, part of the inner walls of each recess 30X is exposed from the wiring layer 31 near the lower surface 30B. As illustrated in FIG. 12B, the solder resist layer 22 of this modified example covers part of the lower surface 31L of each wiring pattern 31A and covers the wall surfaces of each recess 30X exposed from the wiring pattern 31A. Further, the solder resist layer 22 of this modified example entirely covers the lower surface 31L of the conductor pattern 31B and covers the wall surfaces of the recesses 30X exposed from the conductor patterns 31B.

The wiring substrate 20 of the modified example illustrated in FIGS. 12A and 12B may be manufactured by recessing the lower surface 31L of the wiring layer 31 from the lower surface 30B of the insulation layer 30 toward the wiring structure 23 in, for example, the step of FIG. 9A (i.e., step exposing lower surface 31L of wiring layer 31 and lower surface 30B of insulation layer 30).

In the modified example of FIGS. 12A and 12B, the lower surface 31L of the wiring layer 31 is flat. Instead, for example, the lower surface 31L of the wiring layer 31 may be curved. Further, the lower surface 31L of the wiring layer 31 may include both of a flat surface and a curved surface.

In the wiring structure 21 of the above embodiment, the layout of the via wirings 32 and the wiring layer 31 may be changed in any manner.

In the wiring structure 23 of the above embodiment, the number of layers and the layout of the wiring layers 41, 43, and 45 and the insulation layers 40, 42, and 44 may be changed in any manner.

FIG. 13 illustrates a wiring substrate 20A in a modified example. As illustrated in FIG. 13, the wiring structure 23 laminated on the upper surface 30A of the insulation layer 30 may be constructed by sequentially stacking the wiring layer 48, the uppermost insulation layer 44, and the uppermost wiring layer 45. In this manner, the wiring structure 23 may be constructed by at least one insulation layer (insulation layer 44 in this example) and two or more wiring layers (wiring layers 48 and 45 in this example). Also in this case, the glass cloth 30G of the insulation layer 30 is located toward the wiring structure 23 from the center C1 of the insulation layer 30 in the thickness-wise direction. Further, the glass cloth 30G is located at the thickness-wise center of the thickness T3 from the lower surface 30B of the insulation layer 30 to the upper surface of the uppermost wiring layer 45 of the wiring structure 23.

In the wiring substrate 20A, for example, the wiring layer 31 may have a thickness of approximately 3 to 5 µm, the resin layer 35 may have a thickness of approximately 15 to 25 µm, and the resin layer 34 may have a thickness of approximately 3 to 5 µm. Further, in the wiring substrate 20A, for example, the wiring layer 48 may have a thickness of approximately 1 to 3 µm, the insulation layer 44 may have a thickness of approximately 3 to 10 µm, and the wiring layer 45 may have a thickness of approximately 5 to 10 µm.

The wiring layer 48 may be omitted from the wiring structure 23 of the wiring substrate 20A illustrated in FIG. 13.

In the above embodiment, the glass cloth 30G is arranged in the insulation layer 30 so as not to be exposed from the upper surface 30A of the insulation layer 30. However, the glass cloth 30G may be exposed from the insulation layer 30.

Figure 14:
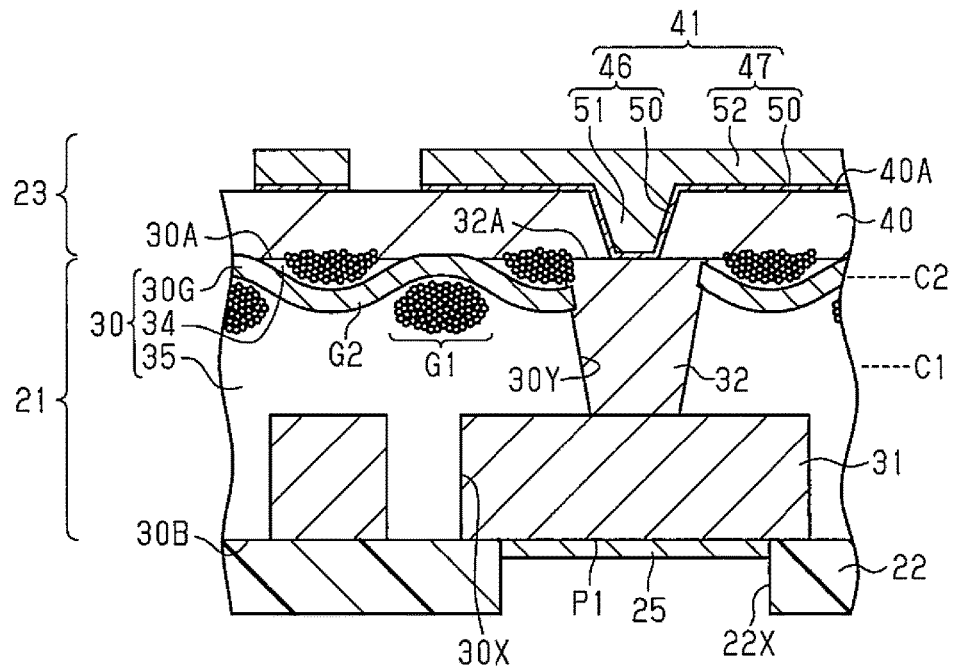
FIG. 14 is a partially enlarged cross-sectional view illustrating a further modified example of the semiconductor device.

For example, as illustrated in FIG. 14, part of the glass cloth 30G may be exposed from the upper surface 30A of the insulation layer 30. However, in this case, the exposed glass cloth 30G will increase the roughness of the upper surface 30A of the insulation layer 30. Thus, it is preferred that the wiring layer 48 (refer to FIGS. 11 and 13) not be formed on the upper surface 30A of the insulation layer 30. That is, it is preferred that the lower end surface of each via wiring 46 be directly connected to the upper end surface 32A of the corresponding via wiring 32.

In the above embodiment, the upper end surface 32A of each via wiring 32 is flush with the upper surface 30A of the insulation layer 30. Instead, for example, the upper end surface 32A of each via wiring 32 may be recessed downward from the upper surface 30A of the insulation layer 30. Alternatively, the upper end surface 32A of each via wiring 32 may project upward from the upper surface 30A of the insulation layer 30.

In the above embodiment, the electronic components mounted on the wiring substrate 20 are not limited to the semiconductor chips 60. For example, instead of the semiconductor chips 60, the electronic components mounted on the wiring substrate 20 may be chip components, such as chip capacitors, chip resistors, and chip inductors and/or quartz oscillators.

Electronic components such as the semiconductor chips 60, chip components, and/or quartz oscillator may be mounted in any manner (for example, flip-chip mounting, wire-bonding mounting, solder mounting, or a combination of these mounting processes).

In the above embodiment, the surface-processed layer 25 may be omitted from the wiring substrate 20.

In the above embodiment, the solder resist layers 22 and 24 are illustrated as examples of the outermost layers of the wiring substrate 20. However, protective insulation layers may be formed from various types of photosensitive insulative resins.

In the above embodiment, the solder resist layers 22 and 24 may be omitted.

In the above embodiment, the encapsulation resin 70 is formed exposing the back surfaces of the semiconductor chips 60. Instead, the encapsulation resin 70 may be formed covering the back surfaces of the semiconductor chips 60.

In the above embodiment, manufacturing is performed in batches. Instead, the wiring substrate 20 may be manufactured one at a time.

In the above embodiment, the support substrate 100 is removed after forming the encapsulation resin 70 that encapsulates the semiconductor chips 60, which are mounted on the wiring substrate 20. However, the support substrate 100 may be removed whenever desired. As long as the rigidity of the structure subsequent to removal of the support substrate 100 may be ensured, there is particularly no limit to when to remove the support substrate 100. For example, the support substrate 100 may be removed immediately after forming the wiring structure 23 on the upper surface 30A of the insulation layer 30.

In the above embodiment, after forming the wiring layer 31 on the metal film 101, the metal film 101 is etched and removed using the wiring layer 31 as an etching mask (refer to FIG. 3D). However, this etching step may be omitted. In this case, for example, the insulation layer 30 is formed on the metal film 101 and the same steps as FIGS. 4B to 8A are performed. Then, the same step as the step of FIG. 8B is performed to remove the support substrate 100. Then, etching is performed to remove the metal film 101, which entirely covers the lower surface 30B of the insulation layer 30 and entirely covers the lower surface 31L of the wiring layer 31. In this case, the process for thinning the insulation layer 30 may be omitted from the step of etching and removing the metal film 101 subsequent to the removal of the support substrate 100.

In the above embodiment, the step of forming the metal film 101 may be omitted from the method for manufacturing the semiconductor device 10. In this case, for example, the wiring layer 31 and the insulation layer 30 are formed on the support substrate 100.

In the above embodiment, the step of thinning the semiconductor chips 60 and the encapsulation resin 70 from the upper surface may be omitted from the method for manufacturing the semiconductor device 10.

The above embodiment may be combined with each of the modified examples when necessary.

CLAUSES

This disclosure further encompasses embodiments describes below.

1. A method for manufacturing a wiring substrate, the method including:

forming a first wiring layer on a support substrate;

forming a first insulation layer on the support substrate to entirely cover a side surface and an upper surface of the first wiring layer, wherein the first insulation layer is formed from a thermosetting insulative resin and including a reinforcement material;

forming a through hole that extends through the first insulation layer in a thickness-wise direction and exposes part of the upper surface of the first wiring layer;

forming a conductive layer covering an upper surface of the first insulation layer, wherein the through hole is filled with the conductive layer;

polishing part of the upper surface of the first insulation layer and the conductive layer projecting from the upper surface of the first insulation layer so that a via wiring including an upper end surface exposed from the upper surface of the first insulation layer is formed in the through hole;

laminating a second wiring structure on the upper surface of the first insulation layer, wherein the second wiring structure includes at least one second insulation layer and two or more second wiring layers, and the at least one second insulation layer is formed from an insulative material of which main component is a photosensitive resin;

exposing a lower surface of the first insulation layer and a lower surface of the first wiring layer by removing the support substrate; and forming a protective insulation layer on the lower surface of the first insulation layer, wherein the second wiring structure has a wiring density that is higher than a wiring density of the first wiring layer, the exposing a lower surface of the first insulation layer and a lower surface of the first wiring layer includes forming the lower surface of the first wiring layer to be flush with the lower surface of the first insulation layer or recessing the lower surface of the first wiring layer from the lower surface of the first insulation layer toward the second wiring structure, the polishing part of the upper surface of the first insulation layer includes polishing the upper surface of the first insulation layer so that the reinforcement material is located toward the upper surface of the first insulation layer from a thickness-wise center of the first insulation layer, and the reinforcement material is located at a thickness-wise center of a thickness from the lower surface of the first insulation layer to an upper surface of an uppermost one of the two or more second wiring layers in the second wiring structure.

2. A method for manufacturing a semiconductor device, the method including:

forming a first wiring layer on a support substrate;

forming a first insulation layer on the support substrate to entirely cover a side surface and an upper surface of the first wiring layer, wherein the first insulation layer is formed from a thermosetting insulative resin and including a reinforcement material;

forming a through hole that extends through the first insulation layer in a thickness-wise direction and exposes part of the upper surface of the first wiring layer;

forming a conductive layer covering an upper surface of the first insulation layer, wherein the through hole is filled with the conductive layer;

polishing part of the upper surface of the first insulation layer and the conductive layer projecting from the upper surface of the first insulation layer so that a via wiring including an upper end surface exposed from the upper surface of the first insulation layer is formed in the through hole;

laminating a second wiring structure on the upper surface of the first insulation layer, wherein the second wiring structure includes at least one second insulation layer and two or more second wiring layers, and the at least one second insulation layer is formed from an insulative material of which main component is a photosensitive resin;

connecting an electronic component to an uppermost one of the two or more second wiring layers in the second wiring structure;

forming an encapsulation resin that encapsulates the electronic component on an upper surface of at uppermost one of the at least one second insulation layer in the second wiring structure;

exposing a lower surface of the first insulation layer and a lower surface of the first wiring layer by removing the support substrate; and forming a protective insulation layer on the lower surface of the first insulation layer, wherein the second wiring structure has a wiring density that is higher than a wiring density of the first wiring layer, the exposing a lower surface of the first insulation layer and a lower surface of the first wiring layer includes forming the lower surface of the first wiring layer to be flush with the lower surface of the first insulation layer or recessing the lower surface of the first wiring layer from the lower surface of the first insulation layer toward the second wiring structure, the polishing part of the upper surface of the first insulation layer includes polishing the upper surface of the first insulation layer so that the reinforcement material is located toward the upper surface of the first insulation layer from a thickness-wise center of the first insulation layer, and the reinforcement material is located at a thickness-wise center of a thickness from the lower surface of the first insulation layer to an upper surface of the uppermost one of the two or more second wiring layers in the second wiring structure.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
    a first wiring structure including
        a first insulation layer formed from a thermosetting insulative resin and including a reinforcement material,
        a recess formed in a lower surface of the first insulation layer,
        a first wiring layer with which the recess is filled, and
        a via wiring including an upper end surface exposed from an upper surface of the first insulation layer, wherein the via wiring extends in a thickness-wise direction through the first insulation layer and is connected to the first wiring layer;
    a protective insulation layer formed on the lower surface of the first insulation layer; and
    a second wiring structure laminated on the upper surface of the first insulation layer, wherein the second wiring structure includes
        at least one second insulation layer formed from an insulative resin of which main component is a photosensitive resin, and
        two or more second wiring layers;
    wherein the upper surface of the first insulation layer and the upper end surface of the via wiring are polished surfaces,
    the first wiring layer includes a lower surface formed to be flush with the lower surface of the first insulation layer or recessed from the lower surface of the first insulation layer toward the second wiring structure, the second wiring structure has a wiring density that is higher than a wiring density of the first wiring structure, and the reinforcement material is located toward the second wiring structure from a thickness-wise center of the first insulation layer and is located at a thickness-wise center of a thickness from the lower surface of the first insulation layer to an upper surface of an uppermost one of the two or more second wiring layers.

2. The wiring substrate according to claim 1, wherein a volume percentage of the first wiring layer and the via wiring occupying the first wiring structure is set to a value that is greater than or equal to a volume percentage of all of the second wiring layers in the second wiring structure occupying the second wiring structure.

3. The wiring substrate according to claim 1, wherein:
the first insulation layer includes
   the reinforcement material,
   a first resin layer that covers an upper surface of the reinforcement material, and
   a second resin layer that covers a lower surface of the reinforcement material; and
the first resin layer is thinner than the second resin layer.

4. The wiring substrate according to claim 3, wherein entire surfaces of the reinforcement material are covered by the first resin layer and the second resin layer.

5. The wiring substrate according to claim 1, wherein the first wiring layer includes a wiring pattern and a dummy pattern that is formed in a region where the wiring pattern is not formed.

6. A semiconductor device comprising:
a first wiring structure including
   a first insulation layer formed from a thermosetting insulative resin and including a reinforcement material,
   a recess formed in a lower surface of the first insulation layer,
   a first wiring layer with which the recess is filled, and
   a via wiring including an upper end surface exposed from an upper surface of the first insulation layer, wherein the via wiring extends in a thickness-wise direction through the first insulation layer and is connected to the first wiring layer;
a protective insulation layer formed on the lower surface of the first insulation layer;
a second wiring structure laminated on the upper surface of the first insulation layer, wherein the second wiring structure includes
   at least one second insulation layer formed from an insulative resin of which main component is a photosensitive resin, and
   two or more second wiring layers;
an electronic component connected to an uppermost one of the two or more second wiring layers in the second wiring structure; and
an encapsulation resin that encapsulates the electronic component, wherein the encapsulation resin is formed on an upper surface of an uppermost one of the at least one second insulation layer in the second wiring structure,
wherein the upper surface of the first insulation layer and the upper end surface of the via wiring are polished surfaces,
the first wiring layer includes a lower surface formed to be flush with the lower surface of the first insulation layer or recessed from the lower surface of the first insulation layer toward the second wiring structure,
the second wiring structure has a wiring density that is higher than a wiring density of the first wiring structure, and
the reinforcement material is located toward the second wiring structure from a thickness-wise center of the first insulation layer and is located at a thickness-wise center of a thickness from the lower surface of the first insulation layer to an upper surface of the uppermost second wiring layer.

* * * * *